United States Patent
Xue et al.

(10) Patent No.: US 12,150,360 B2
(45) Date of Patent: Nov. 19, 2024

(54) PIXEL ARRAY AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Longhui Xue, Beijing (CN); Wei Zhang, Beijing (CN); Benlian Wang, Beijing (CN); Ming Hu, Beijing (CN); Quan Shi, Beijing (CN); Peng Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 583 days.

(21) Appl. No.: 17/434,877

(22) PCT Filed: Oct. 30, 2020

(86) PCT No.: PCT/CN2020/125469
§ 371 (c)(1),
(2) Date: Aug. 30, 2021

(87) PCT Pub. No.: WO2022/052254
PCT Pub. Date: Mar. 17, 2022

(65) Prior Publication Data
US 2022/0352259 A1   Nov. 3, 2022

(30) Foreign Application Priority Data

Sep. 10, 2020  (WO) ................ PCT/CN2020/114619
Sep. 29, 2020  (WO) ................ PCT/CN2020/118991

(51) Int. Cl.
*H10K 59/35* (2023.01)
*H10K 59/122* (2023.01)

(52) U.S. Cl.
CPC ......... *H10K 59/353* (2023.02); *H10K 59/122* (2023.02); *H10K 59/352* (2023.02)

(58) Field of Classification Search
CPC .. H10K 59/353; H10K 59/122; H10K 59/352; H10K 59/12
See application file for complete search history.

(56) References Cited

U.S. PATENT DOCUMENTS 10,446,618 B2  10/2019  Wang et al.
10,720,481 B2  7/2020  Xiao et al.
(Continued)

FOREIGN PATENT DOCUMENTS

CN  104282727 A  1/2015
CN  204885167 U  12/2015
(Continued)

OTHER PUBLICATIONS

Non-Final Office Action dated Feb. 7, 2024 corresponding to U.S. Appl. No. 17/439,861.
(Continued)

*Primary Examiner* — Calvin Y Choi
(74) *Attorney, Agent, or Firm* — Nath, Goldberg & Meyer; Joshua B. Goldberg

(57) ABSTRACT

The present disclosure provides a pixel array and a display device. The pixel array includes first sub-pixels, second sub-pixels and third sub-pixels; the first sub-pixels and the third sub-pixels are alternately arranged along a first direction to form first pixel groups, and are alternately arranged along a second direction to form third pixel groups; the second sub-pixels are arranged along the first direction to form second pixel groups, and are arranged along the second
(Continued)

direction to form fourth pixel groups; wherein the first pixel groups and the second pixel groups are alternately arranged in the second direction; the third pixel groups and the fourth pixel groups are alternately arranged along the first direction; wherein a shape of the second sub-pixel includes a polygon, a plurality of sides of the polygon include straight lines or arcs, and the shape of the second sub-pixel includes at most one symmetry axis.

20 Claims, 19 Drawing Sheets

(56) References Cited

U.S. PATENT DOCUMENTS

| | | | |
|---|---|---|---|
| 11,562,689 | B2 | 1/2023 | Ueno |
| 2005/0248262 | A1 | 11/2005 | Brown |
| 2013/0113363 | A1 | 5/2013 | Hong |
| 2013/0234917 | A1 | 9/2013 | Lee |
| 2014/0319479 | A1 | 10/2014 | Park et al. |
| 2014/0319484 | A1 | 10/2014 | Kwon |
| 2015/0015465 | A1 | 1/2015 | Gong |
| 2015/0123952 | A1 | 5/2015 | Kim et al. |
| 2015/0379924 | A1 | 12/2015 | Matsueda et al. |
| 2016/0078807 | A1 | 3/2016 | Sun et al. |
| 2016/0253943 | A1 | 9/2016 | Wang |
| 2017/0194398 | A1 | 7/2017 | Kim et al. |
| 2017/0317150 | A1 | 11/2017 | Chung et al. |
| 2018/0088260 | A1 | 3/2018 | Jin et al. |
| 2018/0158887 | A1 | 6/2018 | Yun et al. |
| 2018/0254304 | A1 | 9/2018 | Hong et al. |
| 2018/0261654 | A1 | 9/2018 | Hwang et al. |
| 2018/0277040 | A1 | 9/2018 | Lee et al. |
| 2018/0342570 | A1 | 11/2018 | Hong et al. |
| 2019/0140030 | A1* | 5/2019 | Huangfu ............ H10K 59/353 |
| 2019/0140040 | A1 | 5/2019 | Huangfu et al. |
| 2019/0252469 | A1 | 8/2019 | Xiao et al. |
| 2019/0355794 | A1 | 11/2019 | Dai et al. |
| 2019/0363310 | A1 | 11/2019 | Nakamura |
| 2019/0393275 | A1 | 12/2019 | Kim et al. |
| 2020/0127060 | A1 | 4/2020 | Li et al. |
| 2020/0168692 | A1 | 5/2020 | Liu et al. |
| 2020/0273924 | A1 | 8/2020 | Xiao et al. |
| 2020/0343318 | A1 | 10/2020 | Li et al. |
| 2020/0357862 | A1* | 11/2020 | Wang .................. H10K 71/00 |
| 2020/0402442 | A1 | 12/2020 | Liu et al. |
| 2021/0091145 | A1 | 3/2021 | Huangfu et al. |
| 2021/0098539 | A1 | 4/2021 | Zhang et al. |
| 2021/0098540 | A1 | 4/2021 | Chen |
| 2021/0193766 | A1 | 6/2021 | Liu et al. |
| 2021/0335909 | A1 | 10/2021 | Wang et al. |
| 2021/0343800 | A1 | 11/2021 | Zhao |
| 2021/0343801 | A1 | 11/2021 | Wang et al. |
| 2022/0208891 | A1 | 6/2022 | Liu et al. |
| 2022/0310711 | A1 | 9/2022 | Liu et al. |
| 2022/0328573 | A1 | 10/2022 | Hu et al. |
| 2022/0352259 | A1 | 11/2022 | Xue et al. |
| 2023/0006004 | A1 | 1/2023 | Li et al. |
| 2023/0081009 | A1 | 3/2023 | Shi et al. |
| 2023/0087603 | A1 | 3/2023 | Wang et al. |

FOREIGN PATENT DOCUMENTS

| | | | |
|---|---|---|---|
| CN | 205355055 | U | 6/2016 |
| CN | 106486514 | A | 3/2017 |
| CN | 107887404 | A | 4/2018 |
| CN | 207966983 | U | 10/2018 |
| CN | 207966985 | U | 10/2018 |
| CN | 207966988 | U | 10/2018 |
| CN | 207966995 | U | 10/2018 |
| CN | 108922919 | A | 11/2018 |
| CN | 208077981 | U | 11/2018 |
| CN | 109300958 | A | 2/2019 |
| CN | 109860237 | A | 6/2019 |
| CN | 109935617 | A | 6/2019 |
| CN | 208970513 | U | 6/2019 |
| CN | 109994503 | A | 7/2019 |
| CN | 110137206 | A | 8/2019 |
| CN | 110620135 | A | 12/2019 |
| CN | 11341815 | A | 6/2020 |
| CN | 111341815 | A | 6/2020 |
| CN | 111341817 | A | 6/2020 |
| CN | 111416048 | A | 7/2020 |
| CN | 111682056 | A | 9/2020 |
| CN | 111725289 | A | 9/2020 |
| CN | 112436029 | A | 3/2021 |
| CN | 112436030 | A | 3/2021 |
| CN | 112864215 | A | 5/2021 |
| JP | 2005352140 | A | 12/2005 |
| WO | 2022/052010 | A1 | 3/2022 |
| WO | 2022/052834 | A1 | 3/2022 |
| WO | 2022052390 | A1 | 3/2022 |

OTHER PUBLICATIONS

First Office Action dated Feb. 13, 2024 corresponding to Indian application No. 202117060095.
The Extended European Search Report dated Dec. 8, 2023 corresponding to application No. 21865575.1.
The Extended European Search Report dated Nov. 29, 2023 corresponding to application No. 21865889.6.
Office Action dated Dec. 30, 2022 issued in corresponding U.S. Appl. No. 17/850,172.
Office Action dated Dec. 12, 2022 issued in corresponding Australian Application No. 2020450961.
International Search Report issued on Jun. 16, 2021 for application No. PCT/CN2021/070308.
International Search Report issued on Aug. 27, 2021 for application No. PCT/CN2021/096385 with English translation attached.
International Search Report issued on Nov. 8, 2021 for application No. PCT/CN2021/115548 with English translation attached.
Final Office Action dated Apr. 14, 2023 corresponding to U.S. Appl. No. 17/850,172.
Examination report No. 2 for standard patent application dated Apr. 4, 2023 corresponding to Australian application No. 2020450961.
Notice of Reasons for Refusal dated Apr. 13, 2023 corresponding to Japanese application No. 2021-577081.
First Office Action dated Apr. 10, 2023 corresponding to Chinese application No. 202180000017.5.
First Office Action issued on Jun. 1, 2021 for application No. CN202080002174.5 with English translation attached.
Office Action dated Apr. 9, 2024 issued in corresponding U.S. Appl. No. 17/439,940.
Office Action dated May 9, 2024 issued in corresponding Korean Application No. 10-2021-7042230.

* cited by examiner

PIXEL ARRAY AND DISPLAY DEVICE

This is a National Phase Application filed under 35 U.S.C. 371 as a national stage of PCT/CN2020/125469, filed Oct. 30, 2020, an application claiming the benefit of International Application No. PCT/CN2020/114619, filed Sep. 10, 2020, and International Application No. PCT/CN2020/118991, filed Sep. 29, 2020, the content of each of which is hereby incorporated by reference in its entirety.

TECHNICAL FIELD

The present disclosure relates to the field of display technology, and in particular to a pixel array and a display device.

BACKGROUND

Organic Light Emitting Diode (OLED) display devices are one of the hot spots in the research field of current flat panel displays, and compared with liquid crystal display (LCD) devices, OLED display devices have the advantages of low energy consumption, low production cost, self-luminescence, wide viewing angle, fast response speed, and the like. At present, in the flat panel display field, such as a mobile phone, a tablet computer, a digital camera, the OLED display devices have begun to replace the liquid crystal display devices.

The OLED display device mainly includes: a base plate and pixels which are provided on the base plate and arranged in an array. In general, each pixel is formed by an organic material through a high-precision metal mask by using an evaporation film forming technology, and an organic light emitting diode device is formed at a corresponding pixel position on an array substrate.

SUMMARY

The present invention intends to at least solve one of the technical problems in the prior art, and provides a pixel array and a display device.

In a first aspect, an embodiment of the present disclosure provides a pixel array, including first sub-pixels, second sub-pixels and third sub-pixels; the first sub-pixels and the third sub-pixels are alternately arranged along a first direction to form first pixel groups, and are alternately arranged along a second direction to form third pixel groups; the second sub-pixels are arranged along the first direction to form second pixel groups, and are arranged along the second direction to form fourth pixel groups; the first pixel groups and the second pixel groups are alternately arranged in the second direction; the third pixel groups and the fourth pixel groups are alternately arranged along the first direction; a shape of the second sub-pixel includes a polygon, a plurality of sides of the polygon include straight lines or arcs, and the shape of the second sub-pixel includes at most one symmetry axis.

In some embodiment, the second sub-pixel includes a plurality of vertex angles, and a closest distance from an intersection point of extension lines of two sides of at least one vertex angle of the plurality of vertex angles to a boundary of the second sub-pixel is different from a closest distance from an intersection point of extension lines of two sides of the other vertex angle of the second sub-pixel to the boundary of the sub-pixel.

In some embodiment, the second sub-pixel includes an even number of vertex angles, and in at least one pair of vertex angles of the even number of vertex angles, distances from intersection points of extension lines of two sides of the respective vertex angles to a center of the second sub-pixel are different from each other.

In some embodiment, an intersection point of extension lines of two sides of at least one vertex angle of the second sub-pixel is located inside the second sub-pixel.

In some embodiment, an extension direction of a width and an extension direction of a length of the second sub-pixel are used as a defining quadrangle, and the width and the length of the second sub-pixel are used as the width and the length of the defining quadrangle; the second sub-pixel has an area smaller than an area of the defining quadrangle.

In some embodiment, intersection points of extension lines of two sides of at least two vertex angles of the second sub-pixel coincide with two vertex angles of the defining quadrangle.

In some embodiment, a ratio of an area of the second sub-pixel to an area of the defining quadrangle is in a range of 0.5 to 0.95.

In some embodiment, a connection line connecting centers of any two adjacent first sub-pixels and/or a connection line connecting centers of any two adjacent third sub-pixels in the same third pixel group is/are a first connection line; a connection line connecting centers of any two adjacent second sub-pixels in the same fourth pixel group is a second connection line; at least some of the first connection lines are not parallel to the second connection lines.

In some embodiment, the second sub-pixel includes a first corner and a third corner opposite to each other, and a second corner and a fourth corner opposite to each other; the first corner and the third corner are substantially the same in shape, and the second corner and the fourth corner are substantially the same in shape;
  a distance from an intersection point of extension lines of two sides of the first corner of the second sub-pixel to a center of the second sub-pixel is substantially equal to a distance from an intersection point of extension lines of two sides of the third corner to the center of the second sub-pixel; and/or,
  a distance from the intersection point of extension lines of two sides of the second corner of the second sub-pixel to the center of the second sub-pixel is substantially equal to a distance from an intersection point of extension lines of two sides of the fourth corner to the center of the second sub-pixel.

In some embodiment, the plurality of vertex angles of the second sub-pixel include a first corner and a third corner opposite to each other, and a second corner and a fourth corner opposite to each other; the first corner and the third corner are substantially the same in shape, and the second corner and the fourth corner are substantially the same in shape;
  the closest distance from the first corner of the second sub-pixel to a boundary of a light emitting region of the second sub-pixel is substantially equal to the closest distance from the third corner to the boundary of the light emitting region of the second sub-pixel; and/or
  the closest distance from the second corner of the second sub-pixel to the boundary of the light emitting region of the second sub-pixel is substantially equal to the closest distance from the fourth corner to the boundary of the light emitting region of the second sub-pixel.

In some embodiment, a ratio of the closest distance from a vertex of the first corner of the second sub-pixel to the boundary of the light emitting region of the second sub-pixel to the closest distance from a vertex of the second corner to the boundary of the light emitting region of the second sub-pixel is in a range of 1 to 1.8.

In some embodiment, the plurality of vertex angles of the second sub-pixel include a first corner and a third corner opposite to each other, and a second corner and a fourth corner opposite to each other; the second corner, the third corner and the fourth corner are substantially the same in shape;
   a distance from an intersection point of extension lines of two sides of the first corner of the second sub-pixel to a center of the second sub-pixel is greater than a distance from an intersection point of extension lines of two sides of the third corner to the center of the second sub-pixel.

In some embodiment, the plurality of vertex angles of the second sub-pixel include a first corner and a third corner opposite to each other, and a second corner and a fourth corner opposite to each other; and the second corner, the third corner and the fourth corner are substantially the same in shape,
   the closest distance from a vertex of the first corner of the second sub-pixel to a boundary of a light emitting region of the second sub-pixel is greater than the closest distance from a vertex of the third corner to the boundary of the light emitting region of the second sub-pixel.

In some embodiment, a ratio of the closest distance from a vertex of the first corner of the second sub-pixel to the boundary of the light emitting region of the second sub-pixel to a closest distance from a vertex of the third corner to the boundary of the light emitting region of the second sub-pixel is in a range of 1 to 1.8.

In some embodiment, the plurality of vertex angles of the second sub-pixel include a first corner and a third corner opposite to each other, and a second corner and a fourth corner opposite to each other; the first corner and the second corner are substantially the same in shape, and the third corner and the fourth corner are substantially the same in shape;
   a distance from an intersection point of extension lines of two sides of the first corner of the second sub-pixel to a center of the second sub-pixel is greater than a distance from an intersection point of extension lines of two sides of the third corner to the center of the second sub-pixel.

In some embodiment, the plurality of vertex angles of the second sub-pixel include a first corner and a third corner opposite to each other, and a second corner and a fourth corner opposite to each other; the first corner and the second corner are substantially the same in shape, and the third corner and the fourth corner are substantially the same in shape:
   the closest distance from a vertex of the first corner of the second sub-pixel to a boundary of a light emitting region of the second sub-pixel is greater than the closest distance from a vertex of the third corner to the boundary of the light emitting region of the second sub-pixel;
   the closest distance from a vertex of the second corner of the second sub-pixel to the boundary of the light emitting region of the second sub-pixel is greater than the closest distance from a vertex of the fourth corner to the boundary of the light emitting region of the second sub-pixel.

In some embodiment, a ratio of the closest distance from a vertex of the first corner of the second sub-pixel to the boundary of the light emitting region of the second sub-pixel to the closest distance from a vertex of the third corner to the boundary of the light emitting region of the second sub-pixel is in a range of 1 to 1.8; and/or,
   a ratio of the closest distance from a vertex of the second corner of the second sub-pixel to the boundary of the light emitting region of the second sub-pixel to the closest distance from a vertex of the fourth corner to the boundary of the light emitting region of the second sub-pixel is in a range of 1 to 1.8.

In some embodiment, at least one side of the second sub-pixel includes an arc.

In some embodiment, a second virtual quadrangle includes connection lines sequentially connecting centers of two first sub-pixels and two third sub-pixels arranged in an array, and a second sub-pixel is in each second virtual quadrangle:
   a first virtual polygon includes four second virtual quadrangles arranged in an array, and the first sub-pixels and the third sub-pixels are at vertex angles or sides of the first virtual polygon and are alternately arranged on the sides or vertex angles of the first virtual polygon along the clockwise direction.

In some embodiment, inner angles of the quadrangle including connection lines sequentially connecting the centers of the second sub-pixels in at least one first virtual quadrangle are all 90°.

In some embodiment, the quadrangle including connection lines sequentially connecting the centers of the second sub-pixels in at least one first virtual quadrangle has two pairs of inner angles opposite to each other, each inner angle in one of the two pairs is 9) °, and one inner angle in the other pair is greater than 90°, the other inner angle is less than 90°.

In some embodiment, the quadrangle including connection lines sequentially connecting the centers of the second sub-pixels in at least one first virtual quadrangle has four inner angles, each of which is not equal to 90°.

In some embodiment, the quadrangle including connection lines sequentially connecting the centers of the second sub-pixels in at least one first virtual quadrangle has four inner angles, each of which is not equal to 90°, two inner angles opposite to each other have the same angle.

In some embodiment, the quadrangle including connection lines sequentially connecting the centers of the second sub-pixels in at least one first virtual quadrangle includes a virtual parallelogram or a virtual trapezoid.

In some embodiment, first corners of at least some of the second sub-pixels in the first virtual quadrangle have different orientations.

In some embodiment, first corners of the four second sub-pixels in the first virtual quadrangle are on a circle along the clockwise direction, and on a same side of centers of the second sub-pixels.

In some embodiment, in the first virtual quadrangle, two second sub-pixels arranged along the first direction are symmetrically arranged along the second direction; and/or two second sub-pixels arranged along the second direction are symmetrically arranged along the first direction.

In some embodiment, centers of each first sub-pixel and each third sub-pixel in the first pixel group are substantially on a same straight line.

In some embodiment, a connection line connecting centers of each first sub-pixel and each third sub-pixel in the third pixel group is at least partially a polyline, and/or a line connecting each first sub-pixel in the third pixel group and a center in each third sub-pixel is at least partially a polyline.

In a second aspect, an embodiment of the present disclosure provides a display device, which includes the pixel array described above.

DETAIL DESCRIPTION OF EMBODIMENTS

Figure 1:
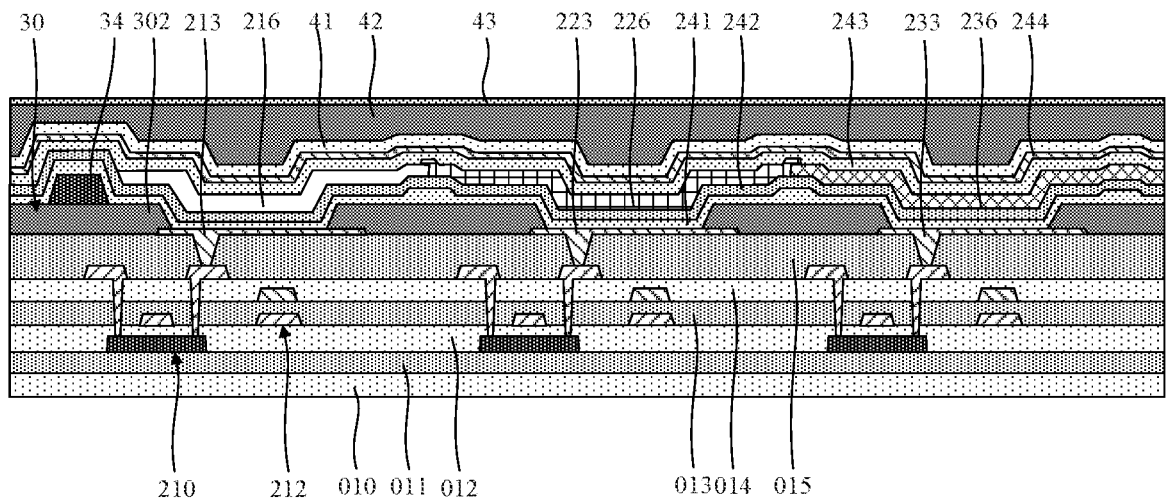
FIG. 1 is a schematic diagram illustrating respective layers of an exemplary pixel array.

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein should have the same meaning as commonly understood by one of ordinary skill in the art to which the present disclosure belongs. The terms of "first", "second", and the like herein are not intended to indicate any order, quantity, or importance, but rather are used for distinguishing one element from another. Further, the term of "a", "an", "the", or the like used herein does not denote a limitation of quantity, but rather denotes the presence of at least one element. The term of "comprising", "including", or the like, means that the element or item preceding the term contains the element or item listed after the term and the equivalent thereof, but does not exclude the presence of other elements or items. The terms "connected", "coupled", and the like are not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationship may also be changed accordingly.

Before describing the pixel array and the display device of the embodiments of the present disclosure, concepts of a sub-pixel, a first sub-pixel, a second sub-pixel, a third sub-pixel, and the like, which are mentioned in the following description, will be explained. In the embodiments of the present disclosure, the pixel array refers to an arrangement of light emitting devices of different colors in a display substrate, and does not limit an arrangement of pixel circuits for driving the respective light emitting devices. Accordingly, it should be understood that the sub-pixel in the embodiments of the present disclosure refers to the light emitting device, and the first sub-pixel, the second sub-pixel, and the third sub-pixel represent sub-pixels of three different colors. The embodiment of the present disclosure will be described by taking an example in which the first sub-pixel is a red sub-pixel, the second sub-pixel is a green sub-pixel, and the third sub-pixel is a blue sub-pixel, which does not limit the scope of the embodiments of the present disclosure. A first direction and a second direction in the embodiments of the present disclosure intersect with each other. For example, one of the first direction and the second direction is a row direction, and the other is a column direction, but the first direction and the second direction may be any direction with a certain included angle. The embodiment of the present disclosure will be described by taking an example in which the first direction is the row direction, and the second direction is the column direction.

Generally, a shape of the sub-pixel depends on a pixel opening in a pixel definition layer, and a light emitting layer is formed at least partially in the pixel opening, which defines a shape of a light emitting region of the sub-pixel, that is, the shape of the sub-pixel in the embodiments of the present disclosure. When the pixel opening is quadrangle, the sub-pixel is quadrangle. In addition, the embodiment of the present disclosure will be described by taking an example in which a shape of at least one of the red sub-pixel, the green sub-pixel, and the blue sub-pixel includes a polygon, and the red sub-pixel, the green sub-pixel, and the blue sub-pixel are all polygons in the embodiment of the present disclosure, and the polygons are quadrangles. The polygon may have three or more corners depending on its shape; a pair of vertex angles means that, for example, the polygon includes N vertex angles, and the vertex angles are sequentially sorted from a same vertex angle as a starting point, the 1st vertex angle and the N/2+1 vertex angle are opposite angles, the 2nd vertex angle and the N/2+1th vertex angle are opposite angles, . . . . . . , and the N/2−1th vertex angle and the Nth vertex angle are opposite angles. For example, a quadrangle or a quadrangle-like shape includes four vertex angles. Each polygon includes four vertex angles which are respectively a first corner (vertex angle), a second corner, a third corner and a fourth corner. As an example, the first corner and the third corner are disposed opposite to each other, and the second corner and the fourth corner are disposed opposite to each other. It should be understood that if the sub-pixel is a polygon, the number of corners thereof may also be more, and this is not limited in the embodiment of the present disclosure. However, it should be noted that the vertex angle in the present embodiment is not necessarily an included angle between two lines, and actually, a portion where two edges forming a certain vertex angle extend to a vertex thereof and meet may be formed as an arc line segment or a straight line segment so that the vertex angle becomes a round chamfer or a flat chamfer.

In order to clarify the structure of each sub-pixel in the pixel array in the embodiment of the present disclosure, respective layers of the pixel array in the embodiment of the present disclosure are described in combination with the manufacturing method for the pixel array. FIG. 1 is a schematic diagram illustrating respective layers of an exemplary pixel array. As shown in FIG. 1, the method specifically may include steps of:

(1) forming a base substrate on a glass carrier plate.

Figure 6:
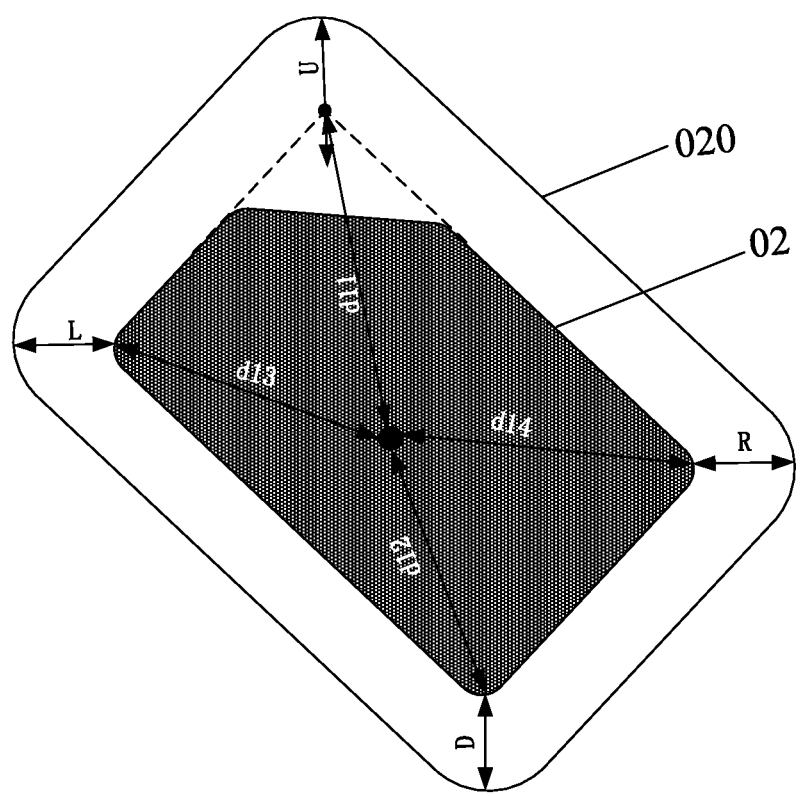
FIG. 6 is a schematic diagram of a green sub-pixel according to an embodiment of the present disclosure.

In some exemplary embodiments, the base substrate 10 may be a flexible base substrate, for example, including a first flexible material layer, a first inorganic material layer, a semiconductor layer, a second flexible material layer, and a second inorganic material layer stacked on the glass carrier plate. The first flexible material layer and the second flexible material layer are made of Polyimide (PI), polyethylene terephthalate (PET) or a polymer soft film subjected to a surface treatment and the like. The first inorganic material layer and the second inorganic material layer are made of silicon nitride (SiNx) or silicon oxide (SiOx) and the like, and are used for improving the water and oxygen resistance of the base substrate. The first inorganic material layer and the second inorganic material layer are also called barrier layers. The material of the semiconductor layer adopts amorphous silicon (a-Si). In some exemplary embodiments, by taking a stacked structure PI1/Barrier1/a-Si/PI2/Barrier2 as an example, the manufacturing procedure includes steps of: firstly, coating a layer of polyimide on the glass carrier plate 1, and forming a first flexible layer (PI1) after curing the layer of polyimide; subsequently, depositing a barrier film on the first flexible layer to form a first barrier layer (Barrier1) covering the first flexible layer; then, depositing an amorphous silicon film on the first barrier layer to form an amorphous silicon layer (a-Si) covering the first barrier layer; then, coating a layer of polyimide on the amorphous silicon layer, and forming a second flexible layer (PI2) after curing the layer of polyimide; then, depositing a barrier film on the second flexible layer to form a second barrier layer (Barrier2) covering the second flexible layer, thereby completing the manufacturing of the base substrate 10, as shown in FIG. 6.

(2) forming a driving structure layer on the base substrate.

The driving structure layer includes a plurality of driving circuits, each of which includes a plurality of transistors and at least one storage capacitor, and is for example, a 2T1C, 3T1C or 7T1C design. Three sub-pixels are taken as an example for illustration, and the driving circuit of each sub-pixel only with one transistor and one storage capacitor is taken as an example for illustration.

In some embodiments, the manufacturing procedure for the driving structure layer may refer to the following description. The manufacturing procedure for the driving circuit of the red sub-pixel 01 will be described as an example.

The method includes the steps of sequentially depositing a first insulating film and an active layer film on the base substrate 10, and patterning the active layer film through a patterning process to form a first insulating layer 011 covering the whole base substrate 010 and an active layer pattern arranged on the first insulating layer 011, such that the active layer pattern at least includes a first active layer.

Subsequently, a second insulating film and a first metal film are sequentially deposited, and the first metal film is patterned through a patterning process to form a second insulating layer 012 covering the active layer pattern, and a first gate metal layer pattern disposed on the second insulating layer 012, such that the first gate metal layer pattern includes at least a first gate and a first capacitor electrode.

Subsequently, a third insulating film and a second metal film are sequentially deposited, and the second metal film is patterned through a patterning process to form a third insulating layer 013 covering the first gate metal layer and a second gate metal layer pattern disposed on the third insulating layer 013, the second gate metal layer pattern at least includes a second capacitor electrode, which is arranged at a position corresponding to a position of the first capacitor electrode.

Subsequently, a fourth insulating film is deposited and patterned through a patterning process to form a pattern of a fourth insulating layer 014 covering the second gate metal layer, such that the fourth insulating layer 014 is provided with at least two first vias formed by etching away parts of the fourth insulating layer 014, the third insulating layer 013 and the second insulating layer 012 at the at least two first vias to expose a surface of the first active layer.

Subsequently, a third metal film is deposited and patterned through a patterning process, and a source-drain metal layer pattern is formed on the fourth insulating layer 014, the source-drain metal layer pattern at least includes a first source and a first drain which are located in the display region. The first source and the first drain may be connected to the first active layer through the first vias, respectively.

In the driving circuit of the red sub-pixel 01 of the display region, the first active layer, the first gate, the first source, and the first drain may constitute a first transistor 210, and the first capacitor electrode and the second capacitor electrode may constitute a first storage capacitor 212. In the above manufacturing procedure, the driving circuit of the green sub-pixel 02 and the driving circuit of the blue sub-pixel 03 may be simultaneously formed.

In some exemplary embodiments, the first insulating layer 011, the second insulating layer 012, the third insulating layer 013, and the fourth insulating layer 014 may be a single layer, a multi-layer, or a composite layer made of any one or more of silicon oxide (SiOx), silicon nitride (SiNx), and silicon oxynitride (SiON). The first insulating layer 011 is called a buffer layer and is used for improving the water and oxygen resistance of the base substrate; the second insulating layer 012 and the third insulating layer 013 are called gate insulator (GI) layers; the fourth insulating layer 014 is called an interlayer dielectric (ILD) layer. The first metal film, the second metal film and the third metal film are made of a metal material, such as any one or more of silver (Ag), copper (Cu), aluminum (Al), titanium (Ti) and molybdenum (Mo), or an alloy material of the above metals, such as aluminum neodymium alloy (AlNd) or molybdenum niobium alloy (MoNb), and may be a single-layer structure or a multi-layer composite structure, such as Ti/Al/Ti, or the like. The active layer film is made of one or more of amorphous indium gallium zinc oxide materials (a-IGZO), zinc oxynitride (ZnON), indium zinc tin oxide (IZTO), amorphous silicon (a-Si), polycrystalline silicon (p-Si), hexathiophene, polythiophene and the like, and the present disclosure is applicable to transistors manufactured based on oxide technology, silicon technology and organic technology.

(3) forming a planarization layer on the base substrate with the above patterns.

In some exemplary embodiments, a planarization film of an organic material is coated on the base substrate 010 on which the aforementioned patterns are formed, such that a planarization (PLN) layer 015 covering the entire base substrate 010 is formed, and a plurality of second vias are formed in the planarization layer 015 of the display region through a mask plate, and exposure and development process. A development process is performed on a part of the planarization layer 015 in the plurality of second vias to expose a surface of the first drain of the first transistor 210 of the driving circuit of the red sub-pixel 01, a surface of the first drain of the first transistor of the driving circuit of the green sub-pixel 02, and a surface of the first drain of the first transistor of the driving circuit of the blue sub-pixel 03, respectively.

(4) forming a first electrode pattern on the base substrate with the above patterns. In some examples, the first electrode is a reflective anode.

In some exemplary embodiments, a conductive film is deposited on the base substrate 010 on which the patterns are formed, and is patterned through a patterning process to form a first electrode pattern. A first anode 213 of the red sub-pixel 01 is connected to the first drain of the first transistor 210 through a second via, a second anode 223 of the green sub-pixel 022 is connected to the first drain of the first transistor of the green sub-pixel 02 through a second via, and a third anode 233 of the blue sub-pixel 23 is connected to the first drain of the first transistor of the blue sub-pixel 03 through a second via.

In some examples, the first electrode may be made of a metal material, such as one or more of magnesium (Mg), silver (Ag), copper (Cu), aluminum (Al), titanium (Ti), and molybdenum (Mo), or an alloy material of the above metals, such as aluminum neodymium alloy (AlNd) or molybdenum niobium alloy (MoNb), and may have a single-layer structure, or a multi-layer composite structure, such as Ti/Al/Ti, or the like, or may have a stack structure made of a metal and a transparent conductive material, such as a reflective material (such as ITO/Ag/ITO, Mo/AlNd/ITO, or the like).

(5) forming a pixel definition layer (PDL) pattern on the base substrate with the patterns.

Figure 12:
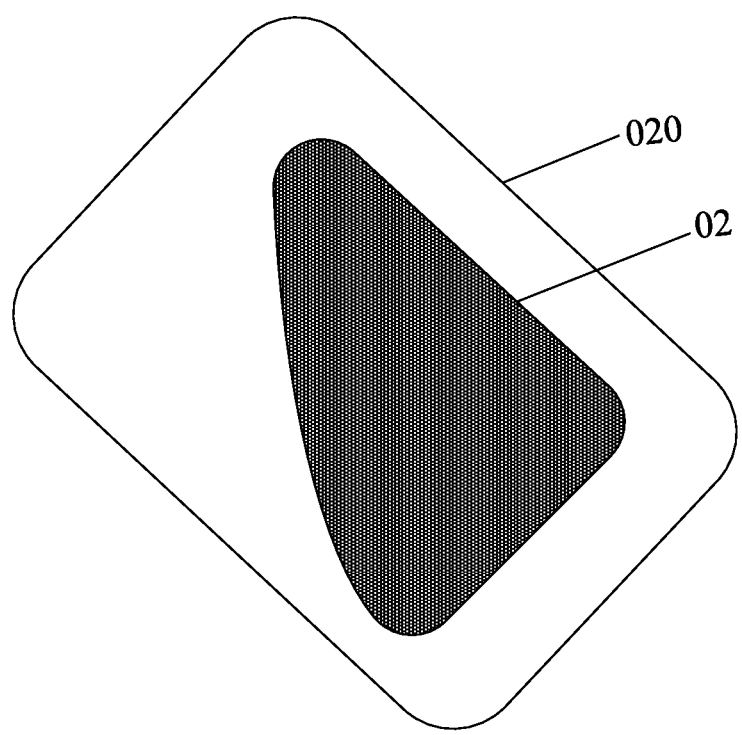
FIG. 12 is a schematic diagram of a green sub-pixel according to an embodiment of the present disclosure.

In some exemplary embodiments, a pixel definition film is coated on the base substrate 010 on which the patterns are formed, and a pixel definition layer pattern is formed through a mask plate and exposure and development processes. As shown in FIG. 12, the pixel definition layer 30 of the display region includes a plurality of sub-pixel definition portions 302, a plurality of pixel definition layer openings 301 are formed between adjacent sub-pixel definition portions 302, and a development process is performed on a part of the pixel definition layer 30 in the plurality of pixel definition layer openings 301 to expose at least a portion of the surface of the first anode 213 of the red sub-pixel 01, at least a portion of the surface of the second anode 223 of the green sub-pixel 02, and at least a portion of the surface of the third anode 233 of the blue sub-pixel 03, respectively.

In some examples, the pixel definition layer 30 may be made of polyimide, acryl, polyethylene terephthalate, or the like.

(6) forming a pattern of a post spacer (PS) on the base substrate with the patterns.

In some exemplary embodiments, an organic material film is coated on the base substrate 010 on which the patterns are formed, a pattern of a post spacer 34 is formed through a mask plate and exposure and development processes. The post spacer 34 may serve as a support layer configured to support an FMM (fine metal mask) during an evaporation process. In some examples, two adjacent post spacers 34 are spaced apart by one repeating unit along a row arrangement direction of the sub-pixels. For example, the post spacer 34 may be located between the red sub-pixel 01 and blue sub-pixel 03 adjacent to each other.

(7) sequentially forming organic functional layers and a second electrode on the base substrate on which the patterns are formed. In some examples, the second electrode is a transparent cathode. A light emitting element can emit light from a side distal to the base substrate 010 through the transparent cathode, thereby realizing top emission. In some examples, the organic functional layers of the light emitting element include: a hole injection layer, a hole transport layer, a light emitting layer, and an electron transport layer.

In some exemplary embodiments, the hole injection layer 241 and the hole transport layer 242 are sequentially formed on the base substrate 010 on which the patterns are formed, by using an open mask through an evaporation process; and then, a blue light emitting layer 236, a green light emitting layer 216, and a red light emitting layer 226 are sequentially formed by using the FMM through an evaporation process; and then, the electron transport layer 243, the cathode 244, and an optical coupling layer 245 are sequentially formed by using an open mask through an evaporation process. The hole injection layer 241, the hole transport layer 242, the electron transport layer 243, and the cathode 244 are all common layers of the plurality of sub-pixels. In some examples, the organic functional layers may further include: a microcavity adjusting layer between the hole transport layer and the light emitting layer. For example, after the hole transport layer is formed, a blue microcavity adjusting layer, the blue light emitting layer, a green microcavity adjusting layer, the green light emitting layer, a red microcavity adjusting layer, and the red light emitting layer may be sequentially formed by using the FMM through an evaporation process.

In some exemplary embodiments, organic functional layers are formed in the sub-pixel region, enabling the organic functional layers to be connected to the anode. The cathode is formed on the pixel definition layer and connected to the organic functional layers.

In some exemplary embodiments, the cathode may be made of any one or more of magnesium (Mg), silver (Ag), aluminum (Al), or an alloy material of any one or more of the above metals, or a transparent conductive material, such as indium tin oxide (ITO), or a multi-layer composite structure of a metal and a transparent conductive material.

In some exemplary embodiments, the optical coupling layer may be formed on a side of the cathode 244 distal to the base substrate 10, and may be a common layer of the plurality of sub-pixels. The optical coupling layer may cooperate with the transparent cathode to increase light output. For example, the material of the optical coupling layer may be a semiconductor material. However, the present embodiment is not limited to this.

(8) forming an encapsulation layer on the base substrate with the patterns.

In some exemplary embodiments, an encapsulation layer is formed on the base substrate 010 on which the patterns are formed, and may include a first encapsulation layer 41, a second encapsulation layer 42, and a third encapsulation layer 43 that are stacked. The first encapsulation layer 41 is made of an inorganic material and covers the cathode 244 in the display region. The second encapsulation layer 42 is made of an organic material. The third encapsulation layer 43 is made of an inorganic material, and covers the first encapsulation layer 41 and the second encapsulation layer 42. However, the present embodiment is not limited to this. In some examples, the encapsulation layer may be made of an inorganic/organic/inorganic/organic/inorganic five-layer structure.

Figure 2:
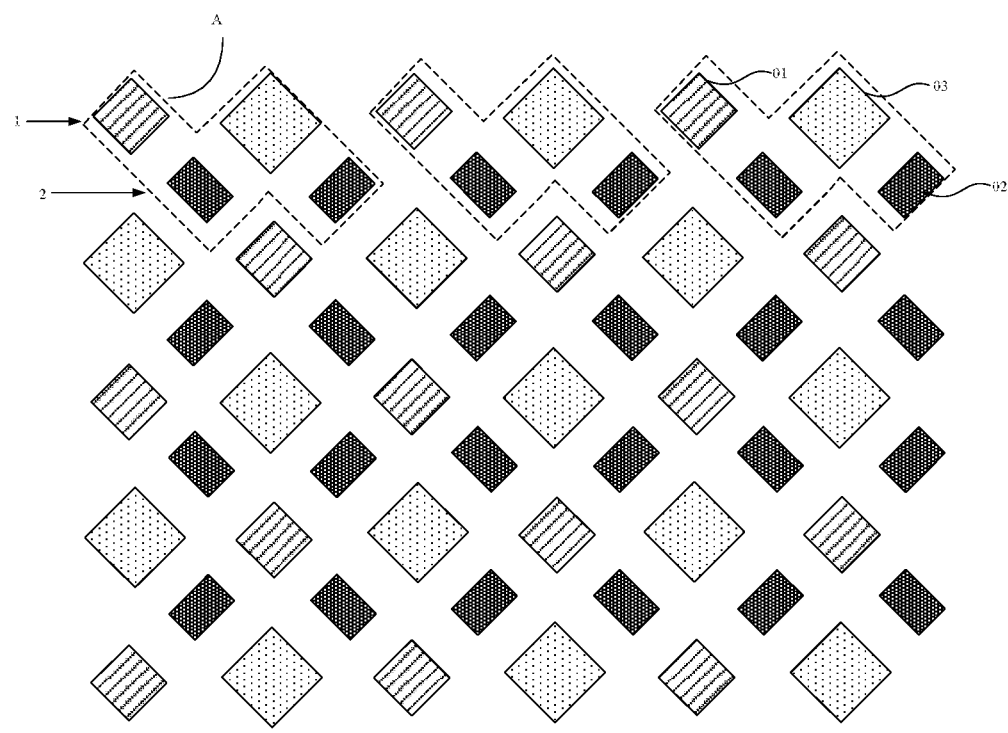
FIG. 2 illustrates a schematic diagram of an exemplary pixel array.

FIG. 2 illustrates a schematic diagram of an exemplary pixel array. As shown in FIG. 2, the pixel array includes a plurality of first pixel rows 1 and a plurality of second pixel rows 2, and the first pixel rows 1 and the second pixel rows 2 are alternately arranged. The first pixel row 1 is formed by alternately arranging red sub-pixels 01 and blue sub-pixels 03, and the red sub-pixels 01 and the blue sub-pixels 03 in the plurality of the first pixel row 1 in a same column are also alternately arranged. The second pixel row 2 is formed by a plurality of green sub-pixels 02 arranged side by side, and the green sub-pixels 02 are arranged in an interleaved manner with the red sub-pixels 01 and the blue sub-pixels 03 in adjacent rows. For such a pixel arrangement, the pixel array may be divided into repeating units arranged in an array, each repeating unit includes sub-pixels in two rows and four columns. That is, each repeating unit includes one red sub-pixel 01, one blue sub-pixel 03, and two green sub-pixels 02, the red sub-pixel 01 and the blue sub-pixel 03 are shared sub-pixels, and the four sub-pixels can realize the display of two virtual pixel units through a virtual algorithm. For example, the red sub-pixel 01 in a second repeating unit in a first row, the blue sub-pixel 03 in a first repeating unit in the first row and the green sub-pixel 02 closest to the blue sub-pixel 03 form a virtual pixel unit, while the red sub-pixel 01 in the second repeating unit in the first row, the blue sub-pixel 03 in the repeating unit and the green sub-pixel 02 closest to the blue sub-pixel form a virtual pixel unit. In addition, the blue sub-pixel 03 in the second repeating unit in the first row, the other green sub-pixel 02 in the repeating unit and the red sub-pixel 01 in a third repeating unit in the first row closest to the green sub-pixel form a virtual pixel unit, so that the resolution of a display panel having the pixel array can be effectively improved.

However, the inventor finds that the actual brightness center formed by each virtual pixel unit is not uniform. Therefore, the embodiment of the present disclosure provides the following technical solution.

Figure 3:
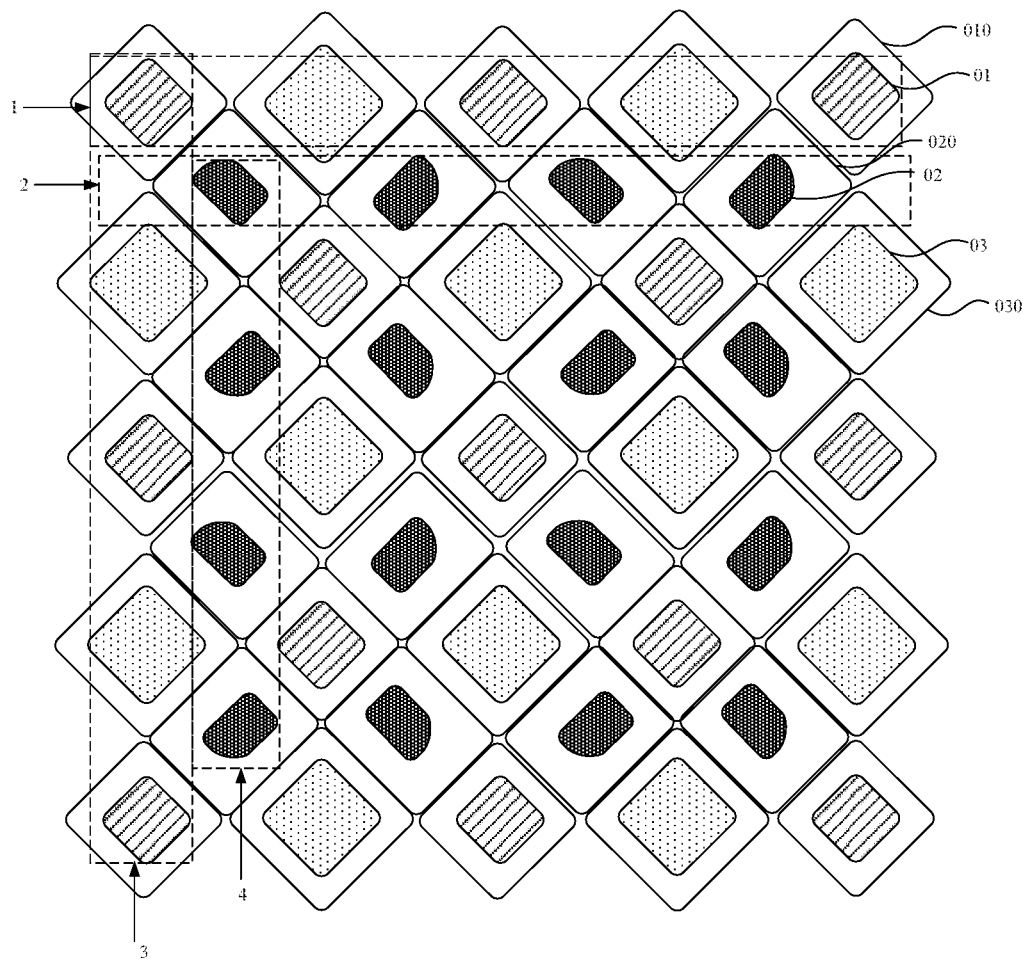
FIG. 3 is a schematic diagram of a pixel array according to an embodiment of the present disclosure.

In a first aspect, FIG. 3 is a schematic diagram of a pixel array according to an embodiment of the present disclosure. As shown in FIG. 3, an embodiment of the present disclosure provides a pixel array, which includes red sub-pixels 01, green sub-pixels 02, and blue sub-pixels 03; the red sub-pixels 01 and the blue sub-pixels 03 are alternately arranged in a row direction to form a first pixel group 1, and the green sub-pixels 02 are arranged side by side to form a second pixel group 2; the red sub-pixels 01 and the blue sub-pixels 03 are alternately arranged in a column direction to form a third pixel group 3, and the green sub-pixels 02 are arranged side by side in a column direction to form a fourth pixel group 4; the first pixel groups 1 and the second pixel groups 2 are alternately arranged in the column direction; the third pixel groups and the fourth pixel groups are alternately arranged in the row direction. In the embodiment of the present disclosure, four sides of a green sub-pixel 02 include straight lines or arcs, and a shape of the green sub-pixel 02 includes at most one symmetry axis. That is, the green sub-pixel 02 may have one symmetry axis. In this case, for example, a first corner and a second corner of the green sub-pixel are substantially the same, and a third corner and a fourth corner are substantially the same. Alternatively, the green sub-pixel 02 may not have the symmetry axis. In this case, for example, one of the first corner, the second corner, the third corner and the fourth corner may have a different shape than the other corners.

In the pixel array of the embodiment of the present disclosure, the shape of the green sub-pixel 02 is adjusted, such that a distance from an intersection point of extension lines of two sides of at least one vertex angle of the green sub-pixel 02 to a center of the sub-pixel is different from a distance from an intersection point of extension lines of two sides of the other vertex angle of the green sub-pixel 02 to the center of the sub-pixel, so that the actual light emitting center of the virtual pixel unit is changed, and the light emitting brightness of the pixel array of the embodiment of the present disclosure is more uniform.

In some embodiments, a distance from an intersection point of extension lines of two sides of at least one vertex angle of the green sub-pixel 02 to a center of the sub-pixel are different from a distance from an intersection point of extension lines of two sides of the other vertex angle of the green sub-pixel 02 to the center of the sub-pixel.

It should be noted that, in the embodiments of the present disclosure, the polygon includes, but is not limited to, a round polygon, a convex polygon, and a concave polygon. The center of the sub-pixel is, for example, a geometric center of the sub-pixel, or an intersection point of perpendicular bisectors of respective sides of the sub-pixel, or a point of approximately equal vertical distances from the respective sides in the sub-pixel. Certainly, the center of the sub-pixel may have a certain error. For example, the center of the sub-pixel is any point within a circle having a radius of 3 μm and a center being the geometric center of the sub-pixel.

If two sides of a vertex angle include substantially straight line portions, the straight line portions are prolonged to be used as extension lines of the two sides of the vertex angle; if two sides of the vertex angle are connected to form a curve with smooth transition, the extension lines of the two sides are formed by tangent lines of a starting point and an ending point of the curve.

In addition, a light emitting region 010 of the red sub-pixel 01, a light emitting region 020 of the green sub-pixel 02, and a light emitting region 030 of the blue sub-pixel 03 are included in the pixel array. The light emitting region of each sub-pixel is, for example, a region having a regular pattern and covering an opening of each sub-pixel corresponding to the region, an area of the region is larger than that of the opening of the corresponding sub-pixel, and the nearest distances from boundaries of respective light emitting regions to the openings of the corresponding sub-pixels are substantially equal to each other. The boundaries of the light emitting regions of two adjacent sub-pixels are adjacent to each other or used in common. In some embodiments, a size of the light emitting region 020 of each sub-pixel is substantially equal to that of an opening of the FMM during an evaporation process is performed on the light emitting materials of respective colors by using the FMM. That is, a size of the light emitting layer of each sub-pixel is substantially equal to the size of the light emitting region, but the size of the light emitting layer of each sub-pixel slightly deviates from the size of the light emitting region due to process alignment, material diffusion and the like. For example, an actual area of the light emitting layer is slightly larger than an area of the corresponding light emitting region. For example, a ratio of the actual area of the light emitting layer to the area of the corresponding light emitting region is 1.01 to 10.5, and further, for example, 1.1 to 1.3. In some embodiments, a size of the light emitting region 020 of a sub-pixel (such as the red sub-pixel and the blue sub-pixel) is substantially equal to that of the opening of the FMM during an evaporation process is performed on the light emitting materials of respective colors by using the FMM, and a size of the light emitting region 020 of a sub-pixel (such as the green sub-pixel) is smaller than that of the opening of the FMM during an evaporation process is performed on the light emitting materials of respective colors by using the FMM. In some embodiments, the light emitting regions corresponding to the sub-pixels are rectangular and do not substantially overlap with each other, but are substantially connected to each other to form a complete continuous plane. In some embodiments, an actual display region of each sub-pixel is substantially a partial region defined by an opening of the pixel definition layer. An orthographic projection of a pixel opening of each sub-pixel on the base substrate falls within an orthographic projection of the light emitting region of the sub-pixel on the base substrate.

In some embodiments, the green sub-pixel 02 includes an even number of vertex angles, and in at least one pair of vertex angles of the even number of vertex angles, distances from intersection points of extension lines of two sides of the respective vertex angles to the center of the green sub-pixel are different. The pair of vertex angles means that, for example, the polygon includes N vertex angles, and the vertex angles are sequentially sorted from a same vertex angle as a starting point, the 1st vertex angle and the N/2+1 vertex angle are opposite angles, the 2nd vertex angle and the N/2+1th vertex angle are opposite angles, . . . . . . , and the N/2−1th vertex angle and the Nth vertex angle are opposite angles.

Figure 4:
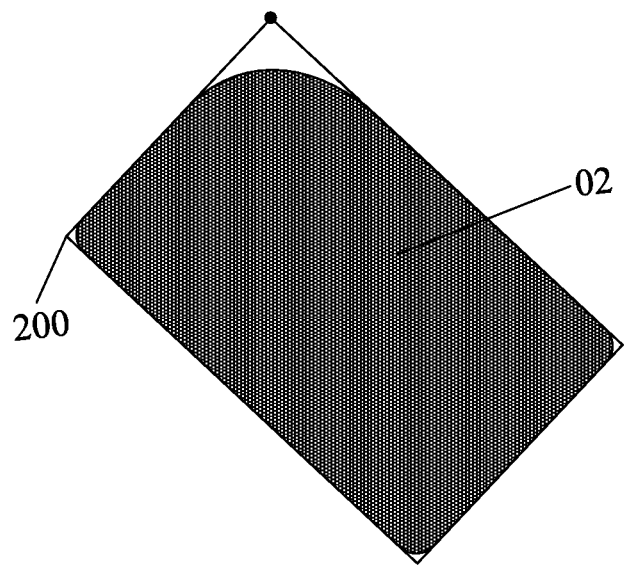
FIG. 4 is a schematic diagram of a green sub-pixel and a defining quadrangle in an embodiment of the present disclosure.

In some embodiments, FIG. 4 is a schematic diagram of a green sub-pixel and a defining quadrangle according to embodiments of the present disclosure. As shown in FIG. 4, an extension direction of a width and an extension direction of a length of the green sub-pixel 02 are taken as a defining quadrangle 200, and the width and the length of the green sub-pixel 02 are taken as the width and the length of the defining quadrangle; the green sub-pixel 02 has an area smaller than an area of the defining quadrangle 200.

A length direction of the second sub-pixel is a direction of the second sub-pixel having the largest dimension, a width direction of the second sub-pixel is a direction perpendicular to the length direction, the length of the second sub-pixel is the largest dimension of the second sub-pixel in the length direction, the width of the second sub-pixel is the largest dimension of the second sub-pixel in the width direction, and the defining quadrangle 200 is a rectangle. In some embodiments, the length and width of the second sub-pixel may be equal to each other, i.e. the defining quadrangle 200 may be substantially quadrangle.

It should be noted that the defining quadrangle 200 is not a structure in the pixel array, but is a standard size defined according to the green sub-pixel 02 in the related art, only for the sake of clarity of the size of the green sub-pixel 02 in the embodiment of the present disclosure.

In the embodiment of the present disclosure, the size of the green sub-pixel 02 is smaller than the size of the defining quadrangle, so that compared to the green sub-pixel 02 in the related art, the center of the green sub-pixel in the embodiment of the present disclosure is changed, and the light emitting center of the pixel array may be effectively improved.

In some embodiments, the intersection points of the extension lines of the two sides of at least two vertex angles of the green sub-pixel 02 coincide with the two vertex angles of the defining quadrangle. The green sub-pixel 02 has a ratio of an area of the opening of the pixel definition layer to an area of the defining quadrangle 200 of 0.5 to 0.95. In some embodiments, the green sub-pixel 02 has a ratio of an area of the opening of the pixel definition layer to an area of the defining quadrangle 200 of 0.5 to 0.98. In some embodiments, the green sub-pixel 02 has a ratio of an area of the opening of the pixel definition layer to an area of the defining quadrangle 200 of 0.8 to 0.9. In some embodiments, the green sub-pixel 02 has a ratio of an area of the opening of the pixel definition layer to an area of the defining quadrangle 200 of 0.7 to 0.8. The size of the green sub-pixel 02 may be specifically set according to requirements of its light emitting center.

In some embodiments, at least two sides of the green sub-pixel 02 at least partially coincide with two sides of the defining quadrangle 200. For example, one long side and one short side of the green sub-pixel 02 at least partially coincide with one long side and one short side, respectively, of the defining quadrangle 200. Alternatively, each side of the green sub-pixel 02 may also at least partially coincide with each side of the defining quadrangle 200.

Figure 5:
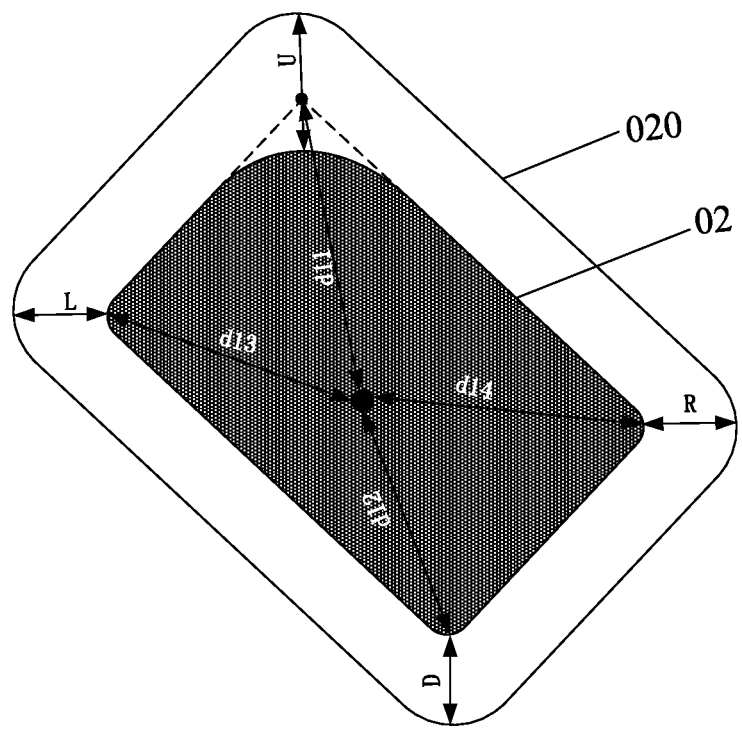
FIG. 5 is a schematic diagram of a green sub-pixel according to an embodiment of the present disclosure.

In some embodiments, FIG. 5 is a schematic diagram of a green sub-pixel according to an embodiment of the present disclosure. As shown in FIG. 5, the second corner, the third corner, and the fourth corner of the green sub-pixel 02 have substantially the same shape, which is different from a shape of the first corner. The first corner is a round chamfer. As shown in FIG. 6, the first chamfer may also be a flat chamfer; the second corner, the third corner, and the fourth corner of the green sub-pixel 02 are substantially the same, e.g. like right angles, i.e. the second corner, the third corner, and the fourth corner of the green sub-pixel 02 may be round corners, but a radius of curvature of the respective round corners is relatively small, and is smaller than a radius of curvature of the first corner. It is noted that the second corner, the third corner, and the fourth corner are substantially the same, which means that, for example, the three corners have the same angle, the same contour, the same size, and the same curvature of the round corner.

It should be noted that when the green pixels shown in FIG. 1 are arranged in the pixel array, the first corners of the green sub-pixels 02 may be oriented in the same direction or in different directions. For example: the first corners of some green sub-pixel 02 face upward, the first corners of some green sub-pixel 02 face downward, the first corners of some green sub-pixel 02 face left, and the first corners of some green sub-pixel 02 face right. Upper and lower in the embodiment of the present disclosure refer to the upper and lower sides of the pixel array in the column direction; left and right refer to left and right sides of the pixel array in the column direction.

With continued reference to FIG. 5, in some embodiments, a distance from the intersection point of the extension lines of the two sides of the first corner of the green sub-pixel 02 to the center of the green pixel is d11; a distance from the intersection point of the extension lines of the two sides of the third corner of the green sub-pixel 02 to the center of the sub-pixel is d12; wherein d11>d12. In addition, a distance from a vertex of the second corner of the green sub-pixel 02 to the center of the green sub-pixel 02 is d13, and a distance from a vertex of the fourth corner of the green sub-pixel 02 to the center of the green sub-pixel 02 is d14. Positions of the center points of the green sub-pixels 02 are different because the first corners have different sizes, and thus, d13 and d14 may or may not be equal to each other.

With continued reference to FIG. 5, closest distances from the first corner, the third corner, the second corner and the fourth corner of the green sub-pixel to the light emitting region 020 thereof are denoted as U, D, L, R, respectively; wherein U>D, L=R, L=D. In one example, a ratio of U to D is substantially 1 to 1.8.

Figure 7:
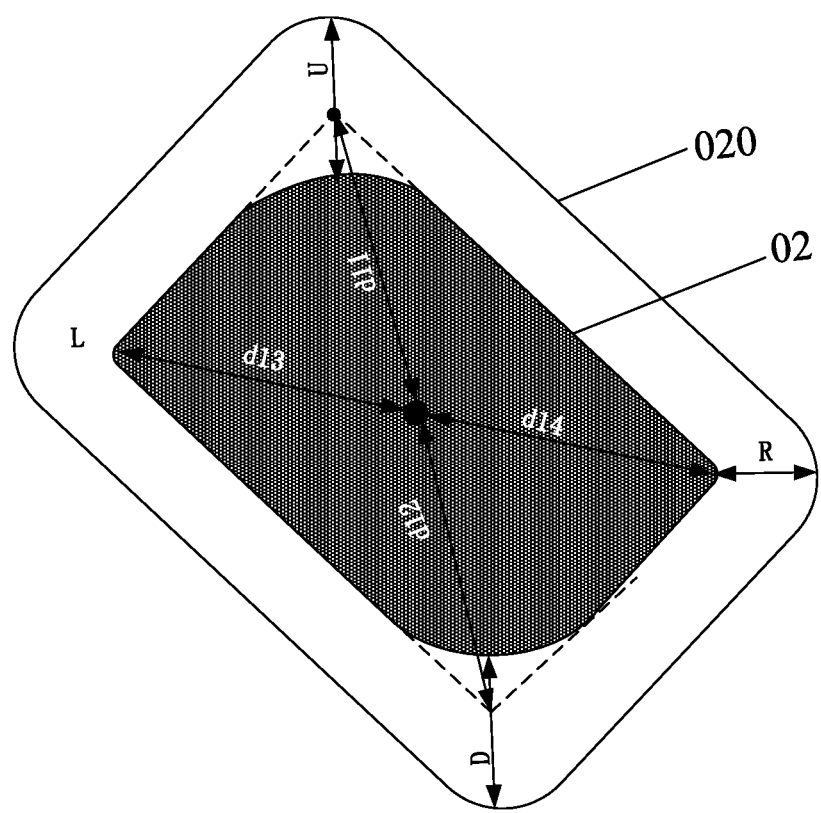
FIG. 7 is a schematic diagram of another green sub-pixel according to an embodiment of the present disclosure.

In some embodiments, FIG. 7 is a schematic diagram of another green pixel of embodiments of the present disclosure. As shown in FIG. 7, the green sub-pixel 02 is different from the green sub-pixel 02 as shown in FIG. 4 in that the first corner and the third corner of the green sub-pixel 02 have substantially the same shape, and the second corner and the fourth corner have substantially the same shape. The first corner and the third corner are the round chamfer or the flat chamfer.

With continued reference to FIG. 7, in some embodiments, a distance from the intersection point of the extension lines of the two sides of the first corner of the green sub-pixel 02 to the center of the green pixel is d11; a distance from the intersection point of the extension lines of the two sides of the third corner of the green sub-pixel 02 to the center of the sub-pixel is d12; wherein d11=d12. In addition, a distance from a vertex of the second corner of the green sub-pixel 02 to the center of the green sub-pixel 02 is d13, and a distance from a vertex of the fourth corner of the green sub-pixel 02 to the center of the green sub-pixel 02 is d14; wherein d13=d14.

With continued reference to FIG. 7, closest distances from the first corner, the third corner, the second corner and the fourth corner of the green sub-pixel to the light emitting region 020 thereof are denoted as U, D, L, R, respectively; wherein, U=D, L=R. in one example, U/D is larger than L/R. For example, U/D is larger than L/R by 1 µm or more. In one example, the ratio of U to D is substantially 1 to 1.8.

Figure 8:
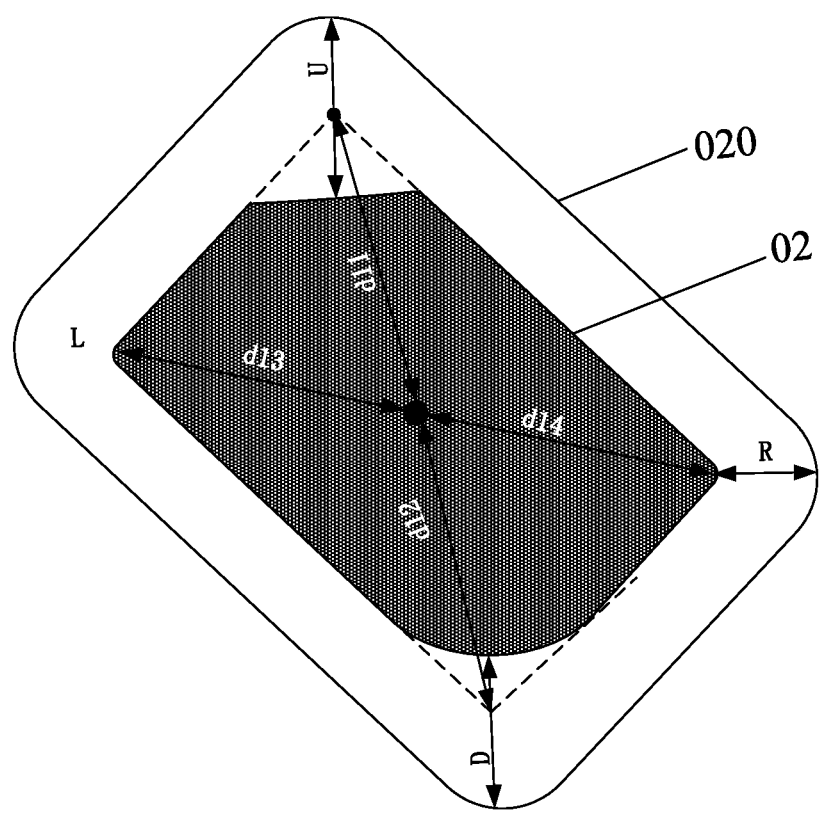
FIG. 8 is a schematic diagram of a green sub-pixel according to an embodiment of the present disclosure.

In some embodiments. FIG. 8 is a schematic diagram of another green sub-pixel according to an embodiment of the present disclosure. As shown in FIG. 7, the green sub-pixel 02 is different from the green sub-pixel 02 as shown in FIG. 7 in that the first corner and the third corner of the green sub-pixel 02 have different shapes, and the second corner and the fourth corner have substantially the same shape. One of the first corner and the third corner is the round chamfer and the other is the flat chamfer. The embodiments of the present disclosure will be described by taking an example in which the first corner is the flat chamfer, and the third corner is the round chamfer.

With continued reference to FIG. 8, the first corner and the third corner are different, and a relationship between the sizes of the first corner and the third corner is unknown. The center position of the green sub-pixel 02 is determined according to the sizes of the first corner and the third corner. A distance from the intersection point of the extension lines of the two sides of the first corner of the green sub-pixel 02 to the center of the green pixel is d11; a distance from the intersection point of the extension lines of the two sides of the third corner of the green sub-pixel 02 to the center of the sub-pixel is d12; wherein d11 and d12 may or may not be equal to each other. In addition, a distance from a vertex of the second corner of the green sub-pixel 02 to the center of the green sub-pixel 02 is d13, and a distance from a vertex of the fourth corner of the green sub-pixel 02 to the center of the green sub-pixel 02 is d14, wherein d13 and d14 may or may not be equal to each other. The relationship between the sizes of the first corner and the third corner is not limited in the present embodiment.

With continued reference to FIG. 8, in some embodiments, closest distances from the first corner, the third corner, the second corner and the fourth corner of the green sub-pixel to the light emitting region 020 thereof are denoted as U, D, L, R, respectively; wherein, in one example, U=D, L=R. U/D is larger than L/R. For example, U/D is larger than L/R by 1 µm or more. In another example, U and D may not be equal to each other, but are within the scope of the embodiments of the present disclosure. In one example, the ratio of U to D is substantially 1 to 1.8.

Figure 9:
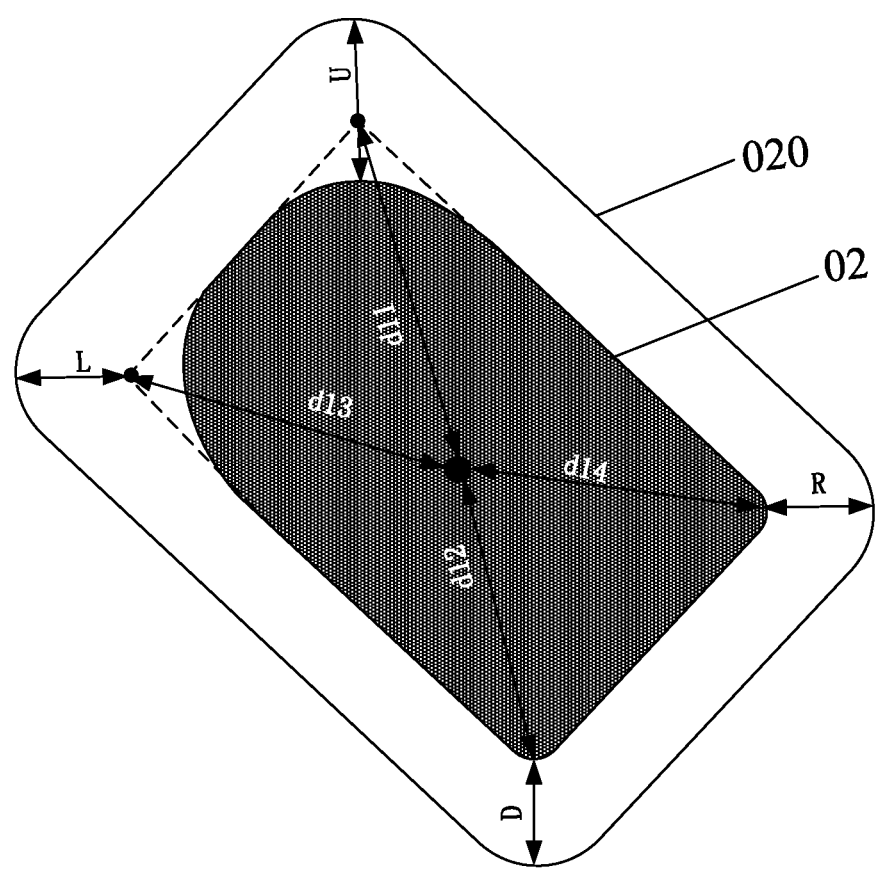
FIG. 9 is a schematic diagram of a green sub-pixel according to an embodiment of the present disclosure.

In some embodiments, FIG. 9 is a schematic diagram of another green sub-pixel according to an embodiment of the present disclosure. As shown in FIG. 9, the green sub-pixel 02 is different from the green sub-pixel 02 as shown in FIG. 7 in that the first corner and the second corner of the green sub-pixel 02 are the round chamfer, and the third corner and the fourth corner are substantially the same in shape.

With continued reference to FIG. 9, a distance from the intersection point of the extension lines of the two sides of the first corner of the green sub-pixel 02 to the center of the green pixel is d11; a distance from the intersection point of the extension lines of the two sides of the third corner of the green sub-pixel 02 to the center of the sub-pixel is d12; a distance from a vertex of the second corner of the green sub-pixel 02 to the center of the green sub-pixel 02 is d13, and a distance from a vertex of the fourth corner of the green sub-pixel 02 to the center of the green sub-pixel 02 is d14; wherein d11 and d13 may or may not be equal to each other according to the relationship between the sizes of the first corner and the third corner; d12 and d14 may be equal to each other. The relationship between the sizes of the first corner and the second corner is not limited in the present embodiment.

With continued reference to FIG. 9, in some embodiments, closest distances from the first corner, the third corner, the second corner and the fourth corner of the green sub-pixel to the light emitting region 020 thereof are denoted as U, D, L, R, respectively; wherein, in one example, U≠D, L≠R, D=R; the size relationship between U and L is not limited in the embodiments of the present disclosure. In one example, the ratio of U to D is substantially 1 to 1.8.

Figure 10:
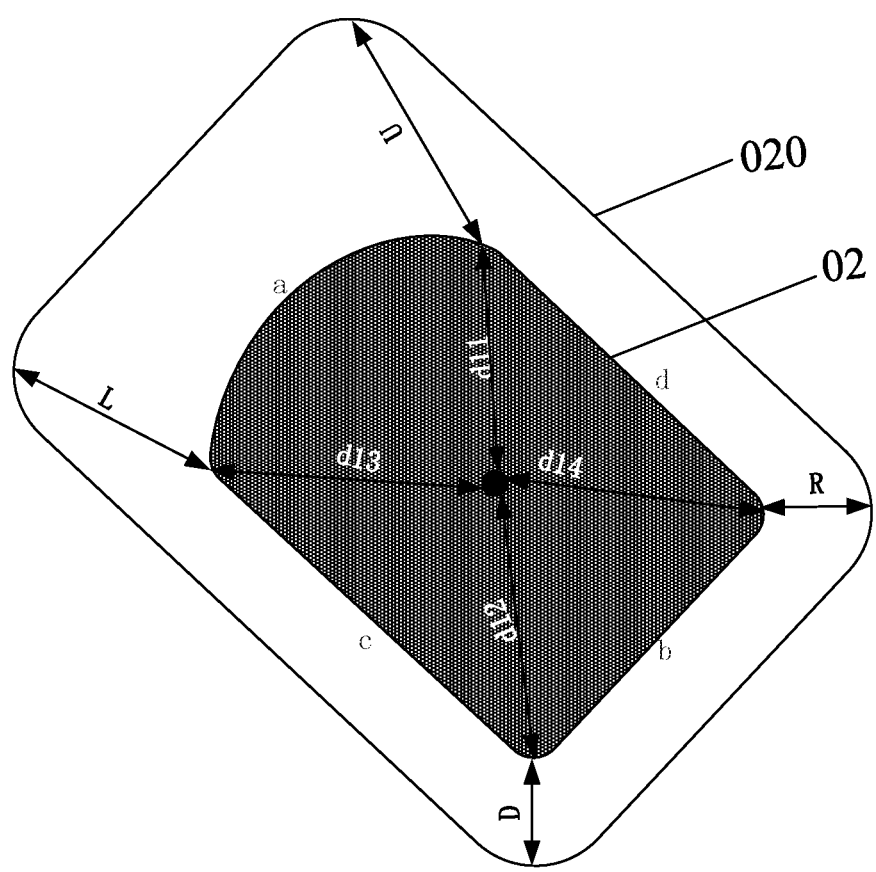
FIG. 10 is a schematic diagram of a green sub-pixel according to an embodiment of the present disclosure.

In some embodiments, FIG. 10 is a schematic diagram of another green sub-pixel in the embodiments of the present disclosure. As shown in FIG. 10, the green sub-pixel 02 includes a first side and a second corner opposite to each other, and a third side c and a fourth side d opposite to each other; wherein the first side is an arc. In this case, the first corner and the second corner have substantially the same shape, and the third corner and the fourth corner have substantially the same shape. The first corner has an angle greater than that of the third corner.

It should be noted that, in the embodiment of the present disclosure, the first side of the green sub-pixel 02 is not limited to an arc, and it is within the protection scope of the embodiment of the present disclosure that at least one of the first side a, the second side b, the third side c, and the fourth side d is an arc. It should be understood that which one of the first side a, the second side b, the third side c, and the fourth side d is an arc, will affect the size of the corner corresponding to the arc. The embodiments of the present disclosure will be described by taking an example in which only the first side a is an arc.

With continued reference to FIG. 10, a distance from the intersection point of the extension lines of the two sides of the first corner of the green sub-pixel 02 to the center of the green pixel is d11; a distance from the intersection point of the extension lines of the two sides of the third corner of the green sub-pixel 02 to the center of the sub-pixel is d12; a distance from a vertex of the second corner of the green sub-pixel 02 to the center of the green sub-pixel 02 is d13, and a distance from a vertex of the fourth corner of the green sub-pixel 02 to the center of the green sub-pixel 02 is d14; wherein d11=d13; d12=d14.

With continued reference to FIG. 10, in some embodiments, closest distances from the first corner, the third corner, the second corner and the fourth corner of the green sub-pixel to the light emitting region 020 thereof are denoted as U, D, L, R, respectively; where, in one example, U=L, D=R, U>D. In one example, the ratio of U to D is substantially 1 to 1.8.

Figure 11:
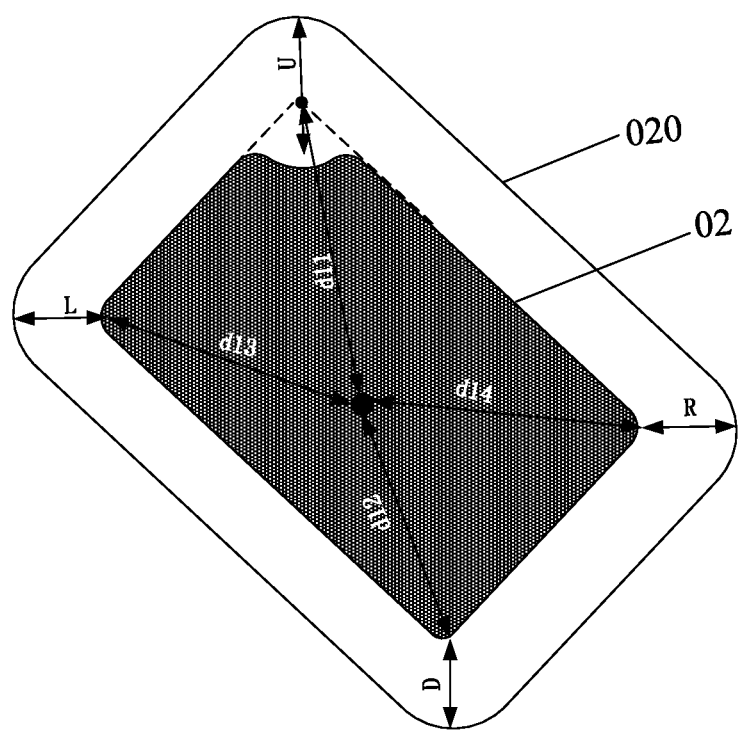
FIG. 11 is a schematic diagram of a green sub-pixel according to an embodiment of the present disclosure.

In another example, FIG. 11 is a schematic diagram of another green sub-pixel in the embodiment of the present disclosure. As shown in FIG. 11, the second corner, the third corner and the fourth corner of the green sub-pixel 02 have substantially the same shape, which is different from the shape of the first corner. The first corner is an inward-concave round corner, but a radius of curvature of the corresponding round corner is relatively small, and is smaller than that of the first corner.

With continued reference to FIG. 11, in some embodiments, a distance from the intersection point of the extension lines of the two sides of the first corner of the green sub-pixel 02 to the center of the green pixel is d11; a distance from the intersection point of the extension lines of the two sides of the third corner of the green sub-pixel 02 to the center of the sub-pixel is d12; wherein d11>d12. In addition, a distance from a vertex of the second corner of the green sub-pixel 02 to the center of the green sub-pixel 02 is d13, and a distance from a vertex of the fourth corner of the green sub-pixel 02 to the center of the green sub-pixel 02 is d14. Positions of the center points of the green sub-pixels 02 are different because the first corners have different sizes, and thus, d13 and d14 may or may not be equal to each other.

With continued reference to FIG. 11, closest distances from the first corner, the second corner, the third corner and the fourth corner of the green sub-pixel 02 to the light emitting region 020 thereof are denoted as U, L, D, R, respectively; wherein U>D, L=R, L=D. In one example, a ratio of U to D is substantially 1 to 1.8.

In another example, FIG. 12 is a schematic diagram of another green sub-pixel according to an embodiment of the present disclosure. As shown in FIG. 12, the green sub-pixel 02 has a fan shape, and two straight sides of the fan shape may or may not be equal to each other. An angle between the two straight sides may be 90°, and may be any angle, which is not limited in the embodiment of the present disclosure.

Figure 13:
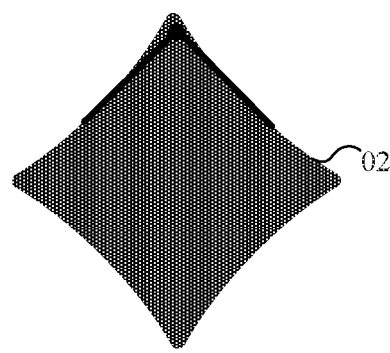
FIG. 13 is a schematic diagram of a green sub-pixel according to an embodiment of the present disclosure.

In another example, FIG. 13 is a schematic diagram of another green sub-pixel of an embodiment of the present disclosure. As shown in FIG. 13, for the green sub-pixel 02 with four vertex angles being convex, intersection points (shown by black dots in FIG. 13) of extension lines of two sides of the four vertex angles in the green sub-pixel 02 are all located in the green sub-pixel 02. Of course, as an example, the four vertex angles have the same shape in FIG. 13, and alternatively, one or more of the four vertex angles may be convex vertex angles, which is not illustrated here.

In some embodiments, a connection line connecting centers of any two adjacent red sub-pixels 01 and/or a connection line connecting centers of any two adjacent blue sub-pixels 03 in the same first pixel group (i.e., in a same row) is/are a first connection line; a connection line connecting centers of any two adjacent green sub-pixels 02 in the same second pixel group (i.e., in a same row) is a second connection line; wherein the first connection lines are not parallel to the second connection lines. That is, in the embodiment of the present disclosure, not only the shape of the green sub-pixel 02 is changed, but also the positions of the green sub-pixel 02, the red sub-pixel 01, and the blue sub-pixel 03 are changed, compared with the prior art.

In some embodiments, a connection line connecting centers of any two adjacent red sub-pixels 01 and/or a connection line connecting centers of any two adjacent blue sub-pixels 03 in the same third pixel group (i.e., in a same column) is/are a first connection line; a connection line connecting centers of any two adjacent green sub-pixels 02 in the same fourth pixel group (i.e., in a same column) is a second connection line; wherein the first connection lines are not parallel to the second connection lines. That is, in the embodiment of the present disclosure, not only the shape of the green sub-pixel 02 is changed, but also the positions of the green sub-pixel 02, the red sub-pixel 01, and the blue sub-pixel 03 are changed, compared with the prior art. In order to clarify the specific structure of the pixel array in the embodiment of the present disclosure, the pixel array is exemplarily described in combination with the shape of the green sub-pixel 02 described above. In some embodiments, for the red sub-pixel 01 and the blue sub-pixel 03 in the pixel array, connection lines connecting centers of the red sub-pixels 01 and the blue sub-pixels 03 in the same first pixel group 1 are substantially on a same straight line, and connection lines connecting centers of the red sub-pixels 01 and the blue sub-pixels 03 in a same column are substantially on a same straight line. In some embodiments of the present disclosure, connection lines connecting centers of the red sub-pixels 01 and the blue sub-pixels 03 in the third pixel group 3 includes at least some polylines. In one example, in the column direction, the connection lines connecting the centers of the red sub-pixels 01 and the blue sub-pixels 03 may be zigzag shape, and lengths of respective polyline segments are substantially equal to each other. In one example, in the row direction, the connection lines connecting the centers of the red sub-pixels 01 and the blue sub-pixels 03 may be zigzag shape, and lengths of respective polyline segments are substantially equal to each other. In one example, in the column direction, the connection lines connecting the centers of the red sub-pixels 01 and the blue sub-pixels 03 may be zigzag shape, and in the row direction, the connection lines connecting the centers of the red sub-pixels 01 and the blue sub-pixels 03 are substantially straight lines. In one example, in the row direction, the connection lines connecting the centers of the red sub-pixels 01 and the blue sub-pixels 03 may be zigzag shape, and in the column direction, the connection lines connecting the centers of the red sub-pixels 01 and the blue sub-pixels 03 are substantially straight lines.

Before describing the structure of the pixel array, firstly, a positional relationship of the red sub-pixel 01, the green sub-pixel 02, the blue sub-pixel 03, and the first virtual quadrangle and the second quadrangle sides will be described.

In some embodiments, the second virtual quadrangle 100 is formed by connection lines sequentially connecting centers of two red sub-pixels 01 and two blue sub-pixels 03 arranged in an array, and a green sub-pixel 02 is disposed in each second virtual quadrangle 100; a first virtual polygon is formed by the four second virtual quadrangles 100 arranged in an array, and the red sub-pixels 01 and the blue sub-pixels 03 are located at the vertex angles or sides of the first virtual polygon and are alternately distributed on the sides or vertex angles of the first virtual polygon along the clockwise direction. It will be described below by taking an example in which the first virtual polygon is the first virtual quadrangle 10.

In one example, four second virtual quadrangles 100 arranged in an array form one first virtual quadrangle 10. A green sub-pixel 02 is provided within one second virtual quadrangle 100, and is substantially located at a center of the second virtual quadrangle 100. For one first virtual quadrangle 10, one red sub-pixel 01 is provided at the center and at four vertex angles, respectively, and one blue sub-pixel 03 is provided at a center of each side of the first virtual quadrangle 10, respectively. The following examples will be described by taking an example in which the first corner of the green sub-pixel 02 is the round chamfer or the flat chamfer. It should be understood that it is within the scope of the present disclosure that at least one of the first corner, the third corner, the second corner, and the fourth corner in the green sub-pixel 02 may have a different shape than the other corners.

Figure 14:
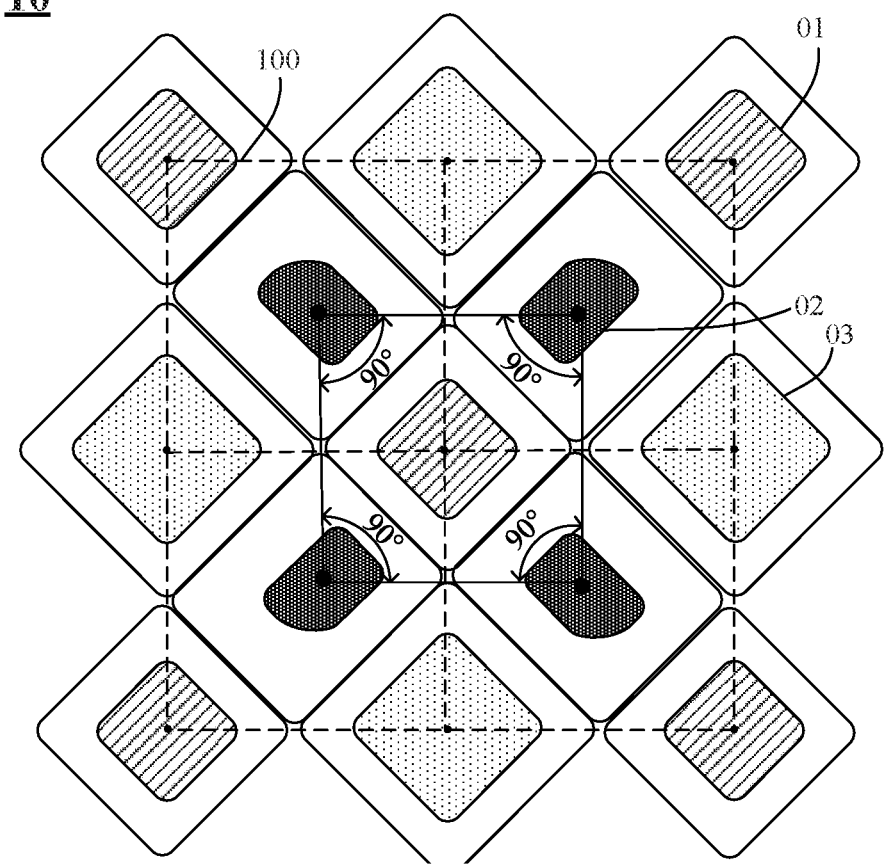
FIG. 14 is a schematic diagram of a first virtual quadrangle of a pixel array in an embodiment of the present disclosure.

In one example, FIG. 14 is a schematic diagram of a first virtual quadrangle of a pixel array of an embodiment of the present disclosure. Referring to FIG. 14, the four green sub-pixels 02 in the first virtual quadrangle 10 are all round chamfers, wherein two green sub-pixels 02 located in the same row (second pixel row) are symmetrically arranged along the column direction, two green sub-pixels 02 located in the same column are symmetrically arranged in the row direction. The first corner of the green sub-pixel 02 at the upper left corner faces upward, the first corner of the green sub-pixel 02 at the upper right corner faces upward, the first corner of the green sub-pixel 02 at the lower left corner faces downward, and the first corner of the green sub-pixel 02 at the lower right corner faces downward. In this case, the quadrangle formed by connection lines sequentially connecting centers of four green sub-pixels 02 has four inner angles, each of which is 90°.

It should be understood that the first corners of the four green sub-pixels 02 in the first virtual quadrangle 10 are replaced with flat chamfers of a same size, which still satisfies the above condition.

Figure 15:
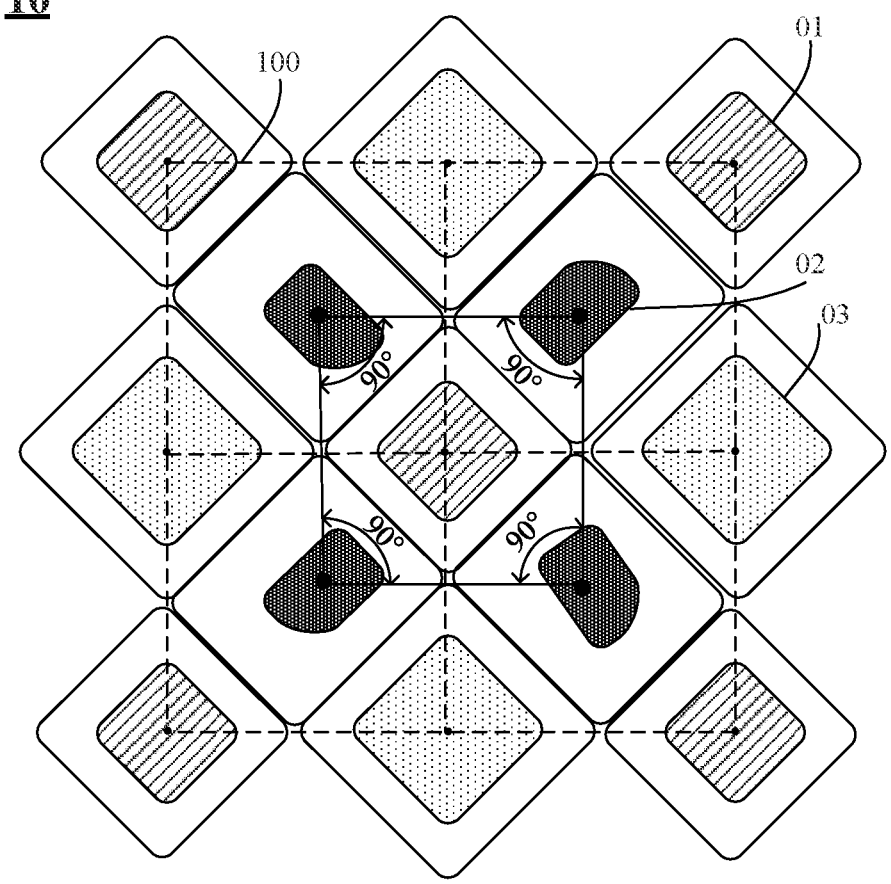
FIG. 15 is a schematic diagram of a first virtual quadrangle of a pixel array in an embodiment of the present disclosure.

In another example, FIG. 15 is a schematic diagram of a first virtual quadrangle of another pixel array of embodiments of the present disclosure. Referring to FIG. 15, for the four green sub-pixels 02 in the first virtual quadrangle 10, the first corner of the green sub-pixel 02 at the upper left corner faces left, the first corner of the green sub-pixel 02 at the upper right corner faces upward, the first corner of the green sub-pixel 02 at the lower left corner faces downward, and the first corner of the green sub-pixel 02 at the lower right corner faces right. In this case, the quadrangle formed by connection lines sequentially connecting centers of four green sub-pixels 02 has four inner angles, each of which is 90°.

It should be understood that the first corners of the four green sub-pixels 02 in the first virtual quadrangle 10 are replaced with flat chamfers of a same size, which still satisfies the above condition.

Figure 16:
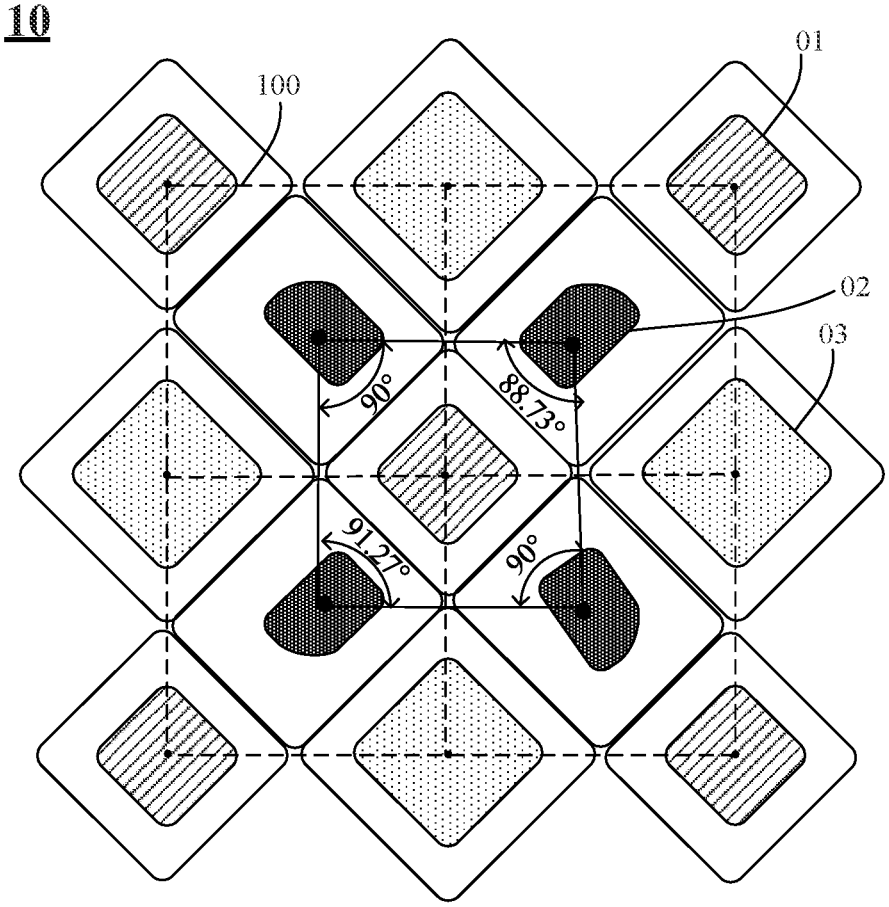
FIG. 16 is a schematic diagram of a first virtual quadrangle of a pixel array in an embodiment of the present disclosure.

In another example, FIG. 16 is a schematic diagram of a first virtual quadrangle in another pixel array of embodiments of the present disclosure. Referring to FIG. 16, for the four green sub-pixels 02 in the first virtual quadrangle 10, the first corners of the four green sub-pixels 02 are located on a circle along the clockwise direction, and located on a same side of centers of respective green sub-pixels 02, that is, the arrangement of the first corners is similar to blades of a windmill, which are inclined to a same side along the circumferential direction. Specifically, the first corner of the green sub-pixel 02 at the upper left corner faces upward, the first corner of the green sub-pixel 02 at the upper right corner faces upward, the first corner of the green sub-pixel 02 at the lower left corner faces downward, and the first corner of the green sub-pixel 02 at the lower right corner faces right. In this case, the quadrangle formed by connection lines sequentially connecting centers of four green sub-pixels 02 has two pairs of inner angles, wherein each inner angle in one of the two pairs is 90° and one inner angle in the other pair is greater than 90°, the other inner angle is less than 90°. With continued reference to FIG. 16, in the quadrangle, each of the inner angles at the upper left corner and at the lower right corner is 90°, the inner angle at the upper right corner is 88.73°, and the inner angle at the lower left corner is 91.27°.

It should be understood that the first corners of the four green sub-pixels 02 in the first virtual quadrangle 10 are replaced with flat chamfers of a same size, which still satisfies the above condition.

Figure 17:
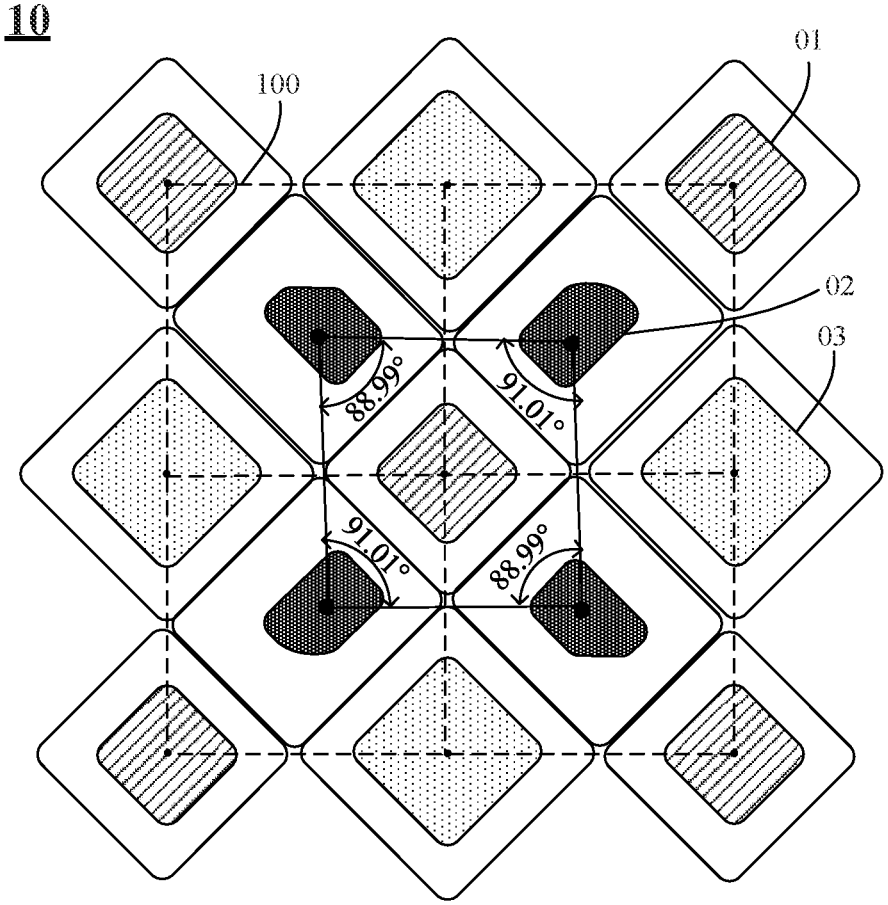
FIG. 17 is a schematic diagram of a first virtual quadrangle of a pixel array in an embodiment of the present disclosure.

In another example, FIG. 17 is a schematic diagram of a first virtual quadrangle of another pixel array in an embodiment of the present disclosure. Referring to FIG. 17, for the four green sub-pixels 02 in the first virtual quadrangle 10, the first corner of the green sub-pixel 02 at the upper left corner is the flat chamfer and faces upward, the first corner of the green sub-pixel 02 at the upper right corner is the round chamfer and faces upward, the first corner of the green sub-pixel 02 at the lower left corner is the round chamfer and faces downward, and the first corner of the green sub-pixel 02 at the lower right corner is the round chamfer and faces downward. In this case, the quadrangle formed by connection lines sequentially connecting centers of four green sub-pixels 02 has four inner angles, which are divided into two pairs of inner angles, wherein both inner angles in each pair of inner angles opposite to each other are equal to each other, and both inner angles in one pair are greater than 90°, both inner angles in the other pair are less than 90°. With continued reference to FIG. 17, in one example, the inner angles at the upper left corner and at the lower right corner are 89.99, and the inner angles at the lower left corner and at the upper right corner are 90.01.

Figure 18:
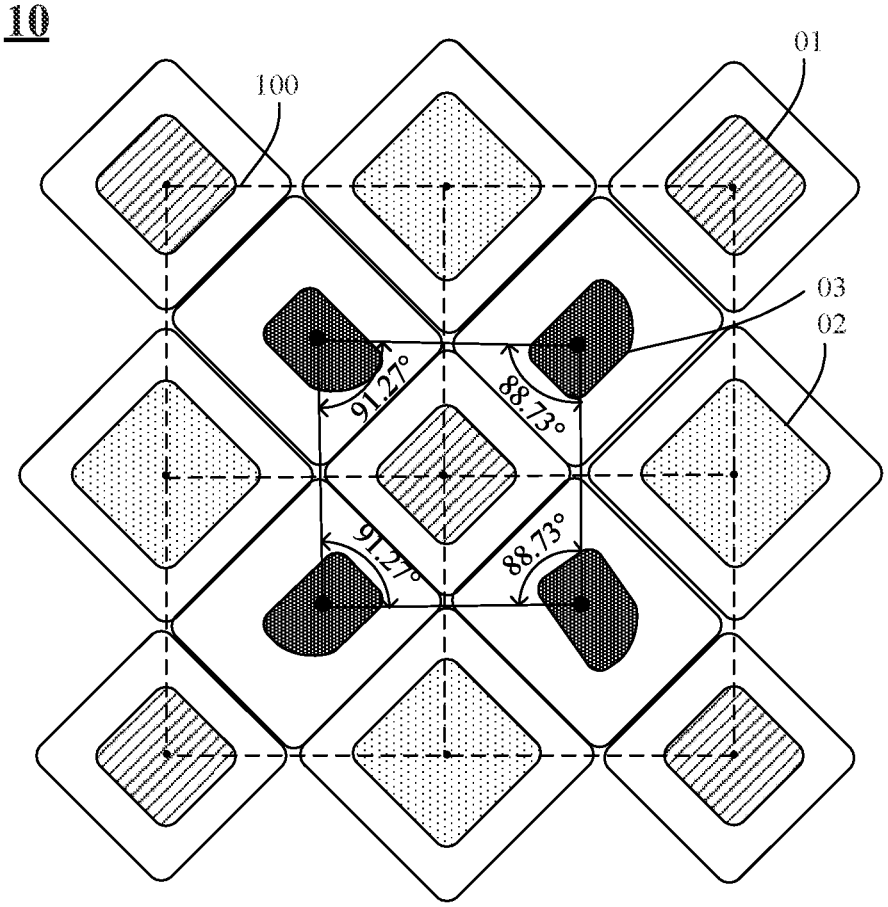
FIG. 18 is a schematic diagram of a first virtual quadrangle of another pixel array in an embodiment of the present disclosure.

In another example, FIG. 18 is a schematic diagram of a first virtual quadrangle of another pixel array of embodiments of the present disclosure. Referring to FIG. 18, the first corners of two green sub-pixels 02 located in the same row (second pixel row) among the four green sub-pixels 02 in the first virtual quadrangle 10 are oriented differently. The first corner of the green sub-pixel 02 at the upper left corner faces upward, the first corner of the green sub-pixel 02 at the upper right corner faces right, the first corner of the green sub-pixel 02 at the lower left corner faces downward, and the first corner of the green sub-pixel 02 at the lower right corner faces right. In this case, the quadrangle formed by connection lines sequentially connecting centers of four green sub-pixels 02 is an isosceles trapezoid and has four inner angles, each of which is not 90°. With continued reference to FIG. 18, in one embodiment, for the four inner angles of the quadrangle, inner angles at upper left and lower left corners are greater than 90°, and inner angles at upper right and lower right corners are less than 90°. For example: inner angles at upper left and lower left corners are 91.27°, and inner angles at upper left and lower left corners are 88.73°.

It should be understood that the first corners of the four green sub-pixels 02 in the first virtual quadrangle 10 are replaced with flat chamfers of a same size, which still satisfies the above condition.

Figure 19:
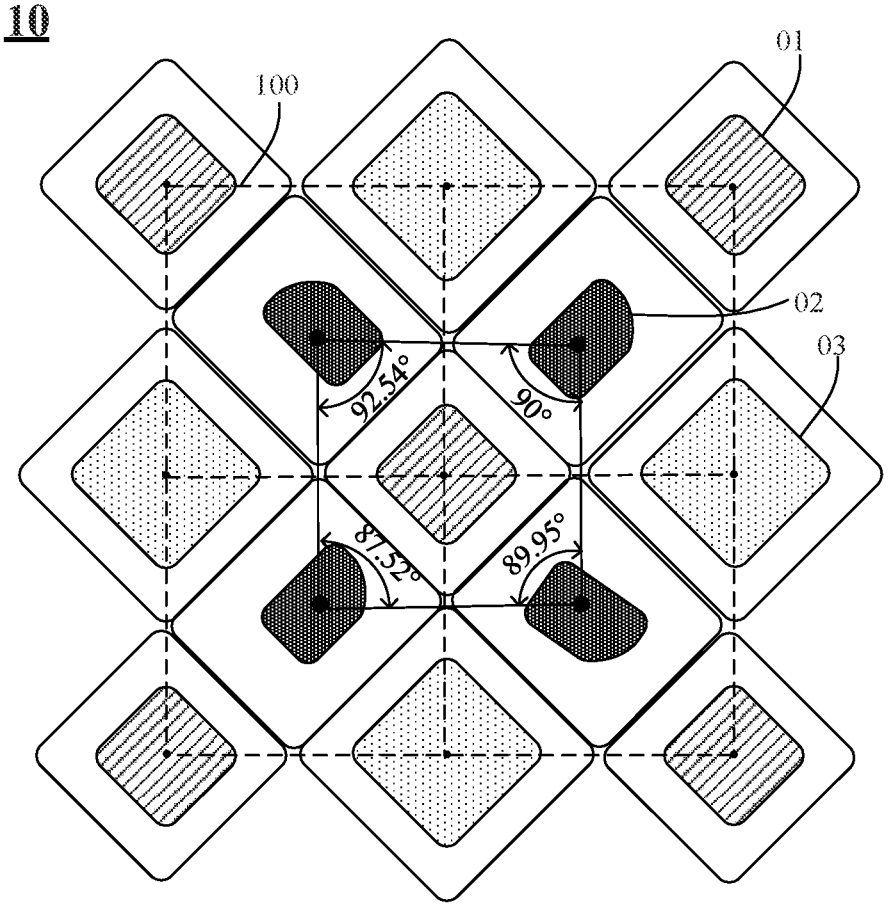
FIG. 19 is a schematic diagram of a first virtual quadrangle of a pixel array in an embodiment of the present disclosure.

In another example, FIG. 19 is a schematic diagram of a first virtual quadrangle of another pixel array in an embodiment of the present disclosure. Referring to FIG. 19, for the four green sub-pixels 02 in the first virtual quadrangle 10, the first corner of the green sub-pixel 02 at the upper left corner faces upward, the first corner of the green sub-pixel 02 at the upper right corner faces right, the first corner of the green sub-pixel 02 at the lower left corner faces right, and the first corner of the green sub-pixel 02 at the lower right corner faces downward. In this case, the quadrangle formed by connection lines sequentially connecting centers of four green sub-pixels 02 has one inner angle of 90°. With continued reference to FIG. 19, in one embodiment, for the four inner angles of the quadrangle, the upper right inner angle is 90°, the upper left inner angle is greater than 90°, and each of the lower left inner angle and the lower right inner angle is less than 90°. For example: the upper left inner angle is 92.54°, the upper right inner angle is 90°, the lower left inner angle is 87.52°, and the lower right inner angle is 89.95°.

It should be understood that the first corners of the four green sub-pixels 02 in the first virtual quadrangle 10 are replaced with flat chamfers of a same size, which still satisfies the above condition.

Figure 20:
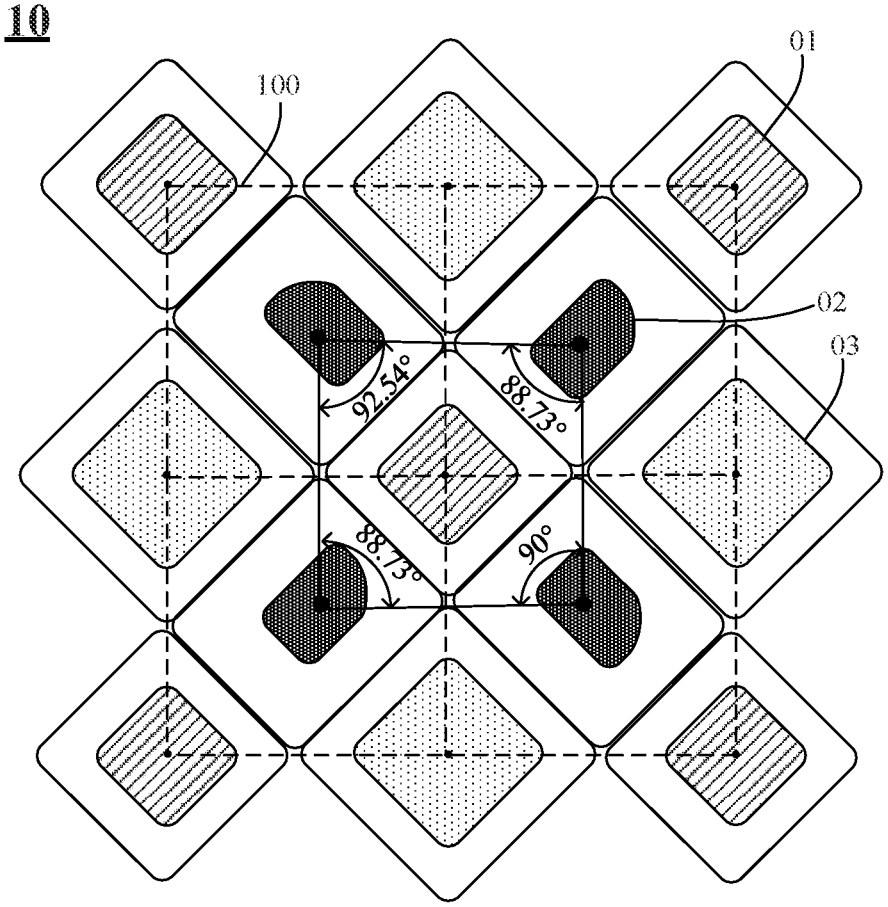
FIG. 20 is a schematic diagram of a first virtual quadrangle of a pixel array in an embodiment of the present disclosure.

In another example, FIG. 20 is a schematic diagram of a first virtual quadrangle of another pixel array of embodiments of the present disclosure. Referring to FIG. 20, for the four green sub-pixels 02 in the first virtual quadrangle 10, the green sub-pixel 02 at the upper left corner and the green sub-pixel 02 at the lower right corner are symmetrically disposed with respect to a connection line connecting the center of the green sub-pixel at the upper right corner and the center of the green sub-pixel 02 at the lower left corner. The first corner of the green sub-pixel 02 at the upper left corner faces upward, the first corner of the green sub-pixel 02 at the upper right corner faces right, the first corner of the green sub-pixel 02 at the lower left corner faces right, and the first corner of the green sub-pixel 02 at the lower right corner faces right. In this case, the quadrangle formed by connection lines sequentially connecting centers of four green sub-pixels 02 has one inner angle of 90 and both inner angles in a pair of inner angles opposite to each other of the quadrangle are equal to each other. With continued reference to FIG. 20, in one embodiment, for the four inner angles of the quadrangle, the lower right inner angle is 90°, the upper left inner angle is greater than 90°, and each of the lower left inner angle and the upper right inner angle is less than 90°. For example: the upper left inner angle is 92.54°, the upper right inner angle is 90°, each of the upper right inner angle and the lower left inner angle is 88.73°.

It should be understood that the first corners of the four green sub-pixels 02 in the first virtual quadrangle 10 are replaced with flat chamfers of a same size, which still satisfies the above condition.

Figure 21:
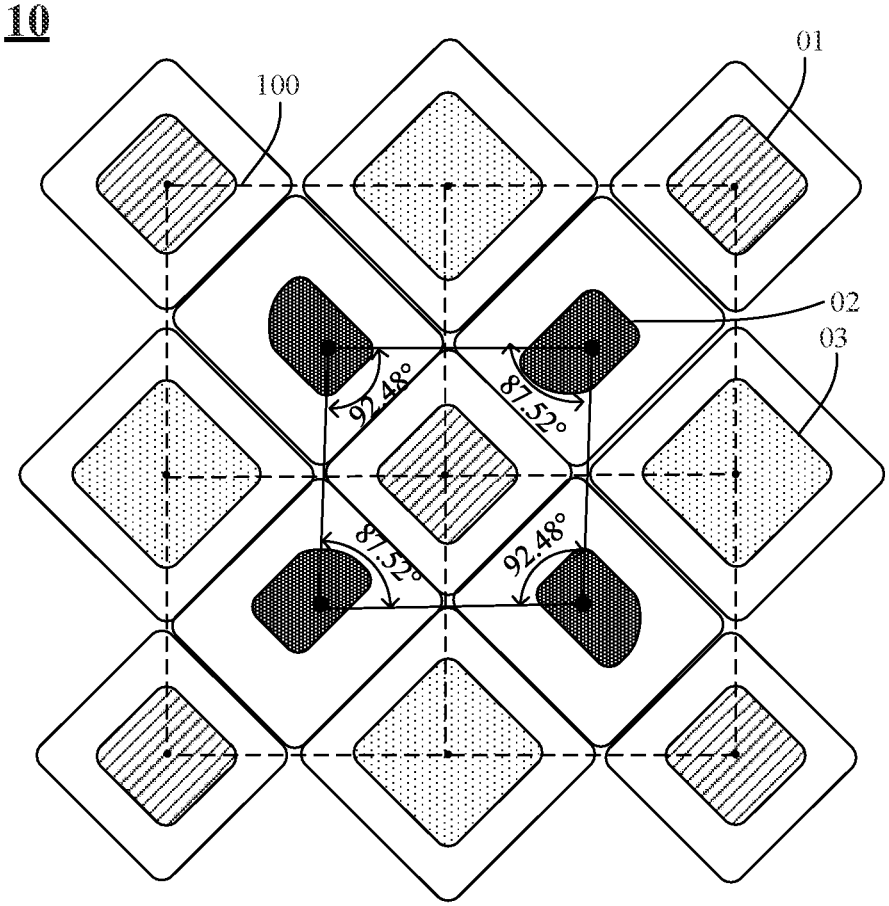
FIG. 21 is a schematic diagram of a first virtual quadrangle of a pixel array in the embodiment of the present disclosure.

In another example, FIG. 21 is a schematic diagram of a first virtual quadrangle of another pixel array of embodiments of the present disclosure. Referring to FIG. 21, the first corners of the four green sub-pixels 02 in the first virtual quadrangle 10 are oriented differently. The first corner of the green sub-pixel 02 at the upper left corner faces left, the first corner of the green sub-pixel 02 at the upper right corner faces downward, the first corner of the green sub-pixel 02 at the lower left corner faces upward, and the first corner of the green sub-pixel 02 at the lower right corner faces right. The green sub-pixel 02 at the upper right corner and the green sub-pixel 02 at the lower left corner are symmetrically disposed with respect to a connection line connecting the center of the green sub-pixel at the upper left corner and the center of the green sub-pixel 02 at the lower right corner. In this case, the quadrangle formed by connection lines sequentially connecting centers of four green sub-pixels 02 has four inner angles, which are divided into two pairs of inner angles, wherein both inner angles in each pair of inner angles opposite to each other are equal to each other. That is, the quadrangle is a parallelogram. With continued reference to FIG. 21, the upper left and lower right inner angles of the four inner angles are 92.48°, and the upper right and lower left inner angles are 87.52°.

Figure 22:
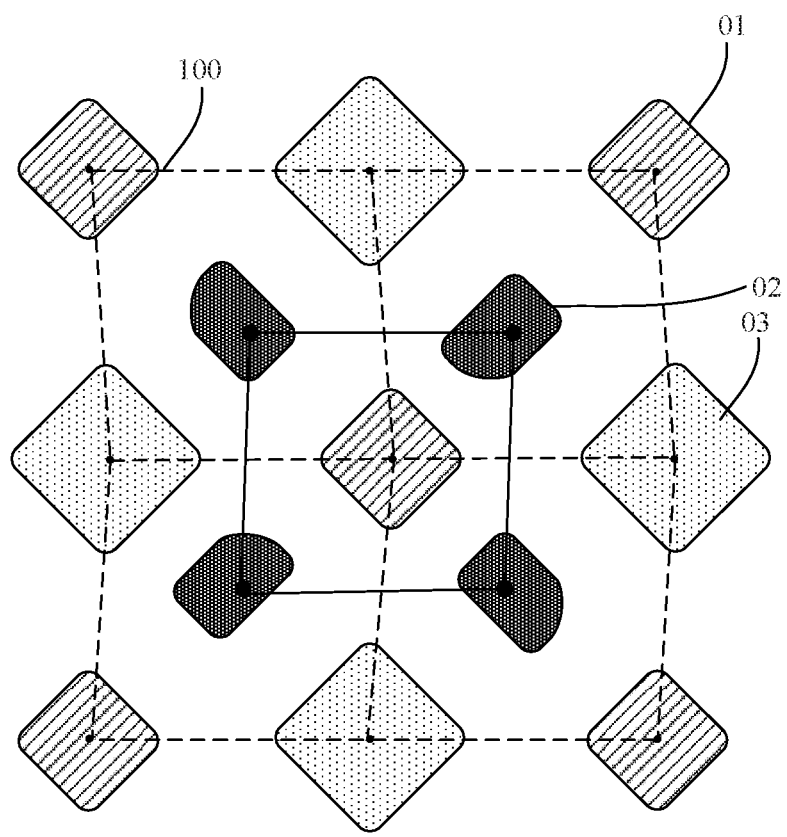
FIG. 22 is a schematic diagram of a first virtual quadrangle of a pixel array in an embodiment of the present disclosure.

In another example, FIG. 22 is a schematic diagram of a first virtual quadrangle of another pixel array of embodiments of the present disclosure. Referring to FIG. 22, in the first virtual quadrangle 10, a connection line connecting centers of the red sub-pixels 01 and the blue sub-pixels 03 in the third pixel group 3 is a polyline, and the second virtual quadrangle 100 is a parallelogram. Alternatively, by adjusting the positions of the red sub-pixels 01 and the blue sub-pixels 03 in the third pixel group 3, that is, by changing positions of the centers of the respective sub-pixels, the second virtual quadrangle 100 may also have other shapes such as an isosceles trapezoid, a right trapezoid, etc. It should be understood that the first corners of the four green sub-pixels 02 in the first virtual quadrangle 10 are replaced with flat chamfers of a same size, which still satisfies the above condition. Alternatively, it is also within the scope of the embodiments of the present disclosure that the first virtual polygon 10 is rotated by 90° with the center of the red sub-pixel 01 at the center of the first virtual polygon 10 as the rotation center, to obtain the pixel array. That is, the row direction is converted into the column direction, and the column direction is converted into the row direction in the drawings.

Figure 23:
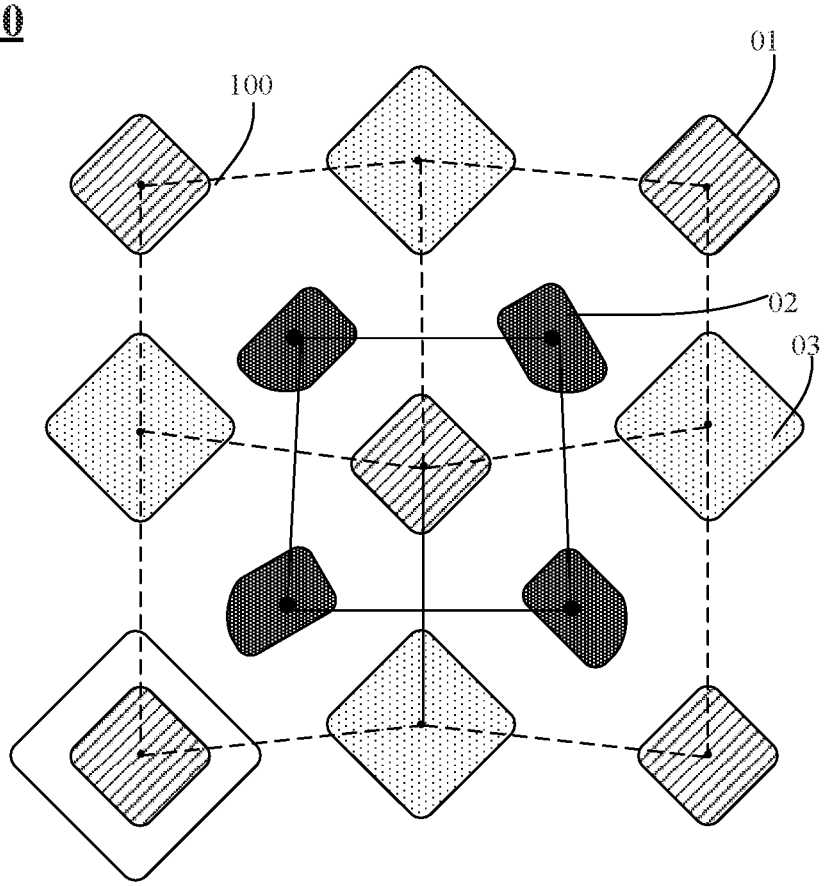
FIG. 23 is a schematic diagram of a first virtual quadrangle of a pixel array in an embodiment of the present disclosure.

In another example, FIG. 23 is a schematic diagram of a first virtual quadrangle of another pixel array of embodiments of the present disclosure. Referring to FIG. 23, in the first virtual quadrangle 10, a connection line connecting centers of the red sub-pixels 01 and the blue sub-pixels 03 in the first pixel group 3 is a polyline, and the second virtual quadrangle 100 is a trapezoid. As shown in FIG. 23, two sides of the formed trapezoid are arranged side by side in a column direction and parallel to each other. In some embodiments, the second virtual quadrangle may be an isosceles trapezoid. Alternatively, by adjusting the positions of the red sub-pixels 01 and the blue sub-pixels 03 in the first pixel group 3, i.e. changing positions of the centers of the respective sub-pixels, the second virtual quadrangle 100 may also be a parallelogram, a right trapezoid and the like. It should be understood that the first corners of the four green sub-pixels 02 in the first virtual quadrangle 10 are replaced with flat chamfers of a same size, which still satisfies the above condition. Alternatively, it is also within the scope of the embodiments of the present disclosure that the first virtual polygon 10 is rotated by 90° with the center of the red sub-pixel 01 at the center of the first virtual polygon 10 as the rotation center, to obtain the pixel array. In some embodiments, as shown in FIG. 23, the quadrangle formed by connecting centers of green sub-pixels of four second virtual quadrangles is also substantially a trapezoid. For example, the trapezoid includes two sides substantially parallel to the row direction. In some embodiments, as shown in FIG. 23, the four green sub-pixels in the four second virtual quadrangles form a 2×2 array, and two green sub-pixels located substantially in the first row is substantially mirror symmetric with respect to a line extending in the column direction, and two green sub-pixels located substantially in the second row is substantially mirror symmetric with respect to a line extending in the column direction.

In some embodiments, as shown in FIG. 23, the first virtual polygon is substantially mirror symmetric with respect to a line parallel to the column direction (the line passes through the center of the red sub-pixel at the center of the first virtual polygon, for example), and is asymmetric with respect to a line parallel to the row direction.

It should be noted that some examples of pixel arrays are only given as above, which does not limit the scope of the embodiments of the present disclosure. It is within the scope of the embodiments of the present disclosure that at least one vertex angle of the green sub-pixel 02 is different from other vertex angles in shape. Alternatively, it is within the scope of the embodiments of the present disclosure that the green sub-pixel 02 may rotate around its center by any angle.

In a second aspect, an embodiment of the present disclosure further provides a display device, which includes any one of the display panels provided in the embodiments of the present disclosure. The display device may be: any product or component with a display function, such as a mobile phone, a tablet computer, a television, a display, a notebook computer, a digital photo frame, a navigator and the like.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A pixel array, comprising first sub-pixels, second sub-pixels and third sub-pixels; wherein
the first sub-pixels and the third sub-pixels are alternately arranged along a first direction to form first pixel groups, and are alternately arranged along a second direction to form third pixel groups; the second sub-pixels are arranged along the first direction to form second pixel groups, and are arranged along the second direction to form fourth pixel groups;
the first pixel groups and the second pixel groups are alternately arranged in the second direction; the third pixel groups and the fourth pixel groups are alternately arranged along the first direction; and
a shape of each of the second sub-pixels comprises a polygon, a plurality of sides of the polygon comprise straight lines or arcs, and the shape of the second sub-pixel comprises at most one symmetry axis; and
the shape of each of the second sub-pixels comprises a quadrangle, which comprises two pairs of opposite corners; in one pair of opposite corners, a closest distance from an intersection point between extension lines of two sides of one corner to a boundary of the second sub-pixel is different from a closest distance from an intersection point between extension lines of two sides of the other corner to the boundary of the second sub-pixel, and in the other pair of opposite corners, a closest distance from an intersection point between extension lines of two sides of one corner to the boundary of the second sub-pixel is equal to a closest distance from an intersection point between extension lines of two sides of the other corner to the boundary of the second sub-pixel.

2. The pixel array of claim 1, wherein in the one pair of opposite corners, a distance from the intersection point between the extension lines of the two sides of one corner to a center of the second sub-pixel is equal to a distance from the intersection point between the extension lines of two sides of the other corner to the center of the second sub-pixel.

3. The pixel array of claim 1, wherein
among the two pairs of opposite corners, there is at least one corner with a vertex angle being convex outwards; and
an intersection point between extension lines of two sides of the vertex angle is inside the second sub-pixel.

4. The pixel array of claim 1, wherein an extension direction of a width and an extension direction of a length of the second sub-pixel are used as an extension direction of a width and an extension direction of a length of a defining quadrangle, respectively, and the width and the length of the second sub-pixel are used as the width and the length of the defining quadrangle; the second sub-pixel has an area smaller than an area of the defining quadrangle; and
a length direction of the second sub-pixel is a direction of the second sub-pixel having a largest dimension, a width direction of the second sub-pixel is a direction perpendicular to the length direction, the length of the second sub-pixel is the largest dimension of the second sub-pixel in the length direction, the width of the second sub-pixel is a largest dimension of the second sub-pixel in the width direction, and the defining quadrangle is a rectangle.

5. The pixel array of claim 4, wherein
the intersection point between extension lines of two sides of each of at least two corners of the second sub-pixel coincides with one of at least two corners of the defining quadrangle, and/or at least two sides of the second sub-pixel at least partially coincide with at least two sides of the defining quadrangle, respectively; or
a ratio of an area of the second sub-pixel to an area of the defining quadrangle is in a range of 0.5 to 0.95.

6. The pixel array of claim 1, wherein a connection line connecting centers of any two adjacent first sub-pixels and/or a connection line connecting centers of any two adjacent third sub-pixels in a same third pixel group is a first connection line; a connection line connecting centers of any two adjacent second sub-pixels in a same fourth pixel group is a second connection line; at least some of the first connection lines are not parallel to the second connection lines; and/or
a connection line connecting centers of any two adjacent first sub-pixels and/or a connection line connecting centers of any two adjacent third sub-pixels in a same first pixel group is a third connection line; a connection line connecting centers of any two adjacent second sub-pixels in a same second pixel group is a fourth connection line; at least some of the third connection lines are not parallel to the fourth connection lines.

7. The pixel array of claim 1, wherein the second sub-pixel comprises a first corner and a third corner opposite to each other; and
 a ratio of the closest distance from a vertex of the first corner of the second sub-pixel to the boundary of a light emitting region of the second sub-pixel to the closest distance from a vertex of the second corner to the boundary of the light emitting region of the second sub-pixel is in a range of 1 to 1.8.

8. The pixel array of claim 1, wherein the second sub-pixel comprises a first corner and a third corner opposite to each other, and a second corner and a fourth corner opposite to each other; the second corner, the third corner and the fourth corner are substantially the same in shape;
 a distance from an intersection point between extension lines of two sides of the first corner of the second sub-pixel to a center of the second sub-pixel is greater than a distance from an intersection point between extension lines of two sides of the third corner to the center of the second sub-pixel or a closest distance from a vertex of the first corner of the second sub-pixel to a boundary of a light emitting region of the second sub-pixel is greater than a closest distance from a vertex of the third corner to the boundary of the light emitting region of the second sub-pixel.

9. The pixel array of claim 8, wherein a ratio of the closest distance from the vertex of the first corner of the second sub-pixel to the boundary of the light emitting region of the second sub-pixel to the closest distance from the vertex of the third corner to the boundary of the light emitting region of the second sub-pixel is in a range of 1 to 1.8.

10. The pixel array of claim 1, wherein the second sub-pixel comprises a first corner and a third corner opposite to each other, and a second corner and a fourth corner opposite to each other; the first corner and the second corner are substantially the same in shape, and the third corner and the fourth corner are substantially the same in shape;
 a distance from an intersection point between extension lines of two sides of the first corner of the second sub-pixel to a center of the second sub-pixel is greater than a distance from an intersection point between extension lines of two sides of the third corner to the center of the second sub-pixel.

11. The pixel array of claim 1, wherein the second sub-pixel comprises a first corner and a third corner opposite to each other, and a second corner and a fourth corner opposite to each other; the first corner and the second corner are substantially the same in shape, and the third corner and the fourth corner are substantially the same in shape;
 a closest distance from a vertex of the first corner of the second sub-pixel to a boundary of a light emitting region of the second sub-pixel is greater than a closest distance from a vertex of the third corner of the second sub-pixel to the boundary of the light emitting region of the second sub-pixel;
 a closest distance from a vertex of the second corner of the second sub-pixel to the boundary of the light emitting region of the second sub-pixel is greater than a closest distance from a vertex of the fourth corner of the second sub-pixel to the boundary of the light emitting region of the second sub-pixel.

12. The pixel array of claim 11, wherein a ratio of the closest distance from a vertex of the first corner of the second sub-pixel to the boundary of the light emitting region of the second sub-pixel to the closest distance from a vertex of the third corner of the second sub-pixel to the boundary of the light emitting region of the second sub-pixel is in a range of 1 to 1.8; and/or a ratio of the closest distance from a vertex of the second corner of the second sub-pixel to the boundary of the light emitting region of the second sub-pixel to the closest distance from a vertex of the fourth corner of the second sub-pixel to the boundary of the light emitting region of the second sub-pixel is in a range of 1 to 1.8; and
 at least one side of the second sub-pixel comprises an arc.

13. The pixel array of claim 1, wherein a second virtual quadrangle comprises connection lines sequentially connecting centers of every two adjacent first sub-pixels and every two adjacent third sub-pixels arranged in an array, and a second sub-pixel of the second sub-pixels is in the second virtual quadrangle; and
 a first virtual polygon comprises four adjacent second virtual quadrangles arranged in an array, and the first sub-pixels and the third sub-pixels are at vertex angles or sides of the first virtual polygon and are alternately arranged on the sides or vertex angles of the first virtual polygon along a clockwise direction; and
 wherein inner angles of a quadrangle comprising connection lines sequentially connecting the centers of the second sub-pixels in at least one first virtual quadrangle are all 90°; or
 a quadrangle comprising connection lines sequentially connecting the centers of the second sub-pixels in at least one first virtual quadrangle has two pairs of inner angles opposite to each other, and each inner angle in one of the two pairs is 90°, and one inner angle in the other pair is greater than 90°, the other inner angle is less than 90°; or
 a quadrangle comprising connection lines sequentially connecting the centers of the second sub-pixels in at least one first virtual quadrangle has four inner angles, each of which is not equal to 90°; or
 a quadrangle comprising connection lines sequentially connecting the centers of the second sub-pixels in at least one first virtual quadrangle has four inner angles, each of which is not equal to 90°, and two inner angles opposite to each other have the same angle; or
 a quadrangle comprising connection lines sequentially connecting the centers of the second sub-pixels in at least one first virtual quadrangle comprises a virtual parallelogram or a virtual trapezoid; or
 first corners of at least some of the second sub-pixels in the first virtual quadrangle have different orientations; or
 first corners of the four second sub-pixels in the first virtual quadrangle are on a circle along a clockwise direction, and on a same side of centers of the second sub-pixels; or
 in the first virtual quadrangle, two second sub-pixels arranged along the first direction are symmetrically arranged along the second direction; and/or two second sub-pixels arranged along the second direction are symmetrically arranged along the first direction.

14. The pixel array of claim 1, wherein
 centers of the first sub-pixels and the third sub-pixels in the first pixel group are substantially on a same straight line; or
 a connection line connecting centers of each first sub-pixel and each third sub-pixel in the third pixel group is at least partially a polyline, and/or a line connecting each first sub-pixel in the third pixel group and a center in each third sub-pixel is at least partially a straight line.

15. A display device comprising the pixel array of claim 1.

16. The pixel array of claim 1, wherein in the other pair of opposite corners, the extension lines of the two sides of each of the opposite corners are substantially perpendicular to each other.

17. The pixel array of claim 1, wherein in the one pair of opposite corners, the extension lines of the two sides of one of the opposite corners are substantially perpendicular to each other.

18. The pixel array of claim 1, wherein in the one pair of opposite corners, one corner is an inward-concave round corner; and an inner angle of the other corner is substantially a right angle.

19. The pixel array of claim 1, wherein each of the two pairs of opposite corners is a flat chamfer or a round chamfer.

20. The pixel array of claim 13, wherein four green sub-pixels in the first virtual quadrangle each have a corner with a round chamfer;
- two green sub-pixels of the four green sub-pixels located in a same row are symmetrically arranged along the second direction; two green sub-pixels located in a same column are symmetrically arranged in the first direction;
- the corner with the round chamfer of the green sub-pixel at an upper left side faces towards an upper left direction, the corner with the round chamfer of the green sub-pixel at an upper right side faces towards an upper right direction, the corner with the round chamfer of the green sub-pixel at a lower left side faces towards a lower left direction, and the corner with the round chamfer of the green sub-pixel at a lower right side faces towards a lower right direction.

* * * * *